United States Patent
Lang et al.

(10) Patent No.: US 9,786,868 B2
(45) Date of Patent: Oct. 10, 2017

(54) ELECTRONIC STRUCTURE HAVING AT LEAST ONE METAL GROWTH LAYER AND METHOD FOR PRODUCING AN ELECTRONIC STRUCTURE

(71) Applicant: OSRAM OLED GmbH, Regensburg (DE)

(72) Inventors: Erwin Lang, Regensburg (DE); Philipp Schwamb, Regensburg (DE); David Hartmann, Erlangen (DE); Guenter Schmid, Hemhofen (DE); Florian Eder, Erlangen (DE); Sabine Szyszkowski, Dachsbach (DE); Wiebke Sarfert, Herzogenaurach (DE)

(73) Assignee: Osram OLED GmBH, Regensburg (DE)

(*) Notice: Subject to any disclaimer, the term of this patent is extended or adjusted under 35 U.S.C. 154(b) by 0 days.

(21) Appl. No.: 14/386,016

(22) PCT Filed: Mar. 19, 2013

(86) PCT No.: PCT/EP2013/055665
§ 371 (c)(1),
(2) Date: Sep. 18, 2014

(87) PCT Pub. No.: WO2013/139775
PCT Pub. Date: Sep. 26, 2013

(65) Prior Publication Data
US 2015/0311471 A1    Oct. 29, 2015

(30) Foreign Application Priority Data

Mar. 20, 2012 (DE) .................. 10 2012 204 432

(51) Int. Cl.
*H01L 51/50* (2006.01)
*H01L 51/52* (2006.01)
(Continued)

(52) U.S. Cl.
CPC ........ *H01L 51/5234* (2013.01); *H01L 51/102* (2013.01); *H01L 51/441* (2013.01);
(Continued)

(58) Field of Classification Search
CPC .................................................. H01L 51/5092
See application file for complete search history.

(56) References Cited

U.S. PATENT DOCUMENTS 5,128,587 A * 7/1992 Skotheim ............ H01L 51/0089
313/498
5,134,039 A * 7/1992 Alexander .......... C23C 18/1635
419/19
(Continued)

FOREIGN PATENT DOCUMENTS

CN      1269690 A     10/2000
EP      1024542 A1     8/2000
(Continued)

OTHER PUBLICATIONS

Controlled Electroless Deposition of Noble Metal Nanoparticle Films on Germanium Surfaces, Lon A. Porter, Jr., Hee Cheul Choi, Alexander E. Ribbe, and, and Jillian M. Buriak; Nano Letters 2002 2 (10), 1067-1071.*
(Continued)

*Primary Examiner* — Kyoung Lee
*Assistant Examiner* — Christina Sylvia
(74) *Attorney, Agent, or Firm* — Viering, Jentschura & Partner mbB

(57) ABSTRACT

Various embodiments may relate to an electronic structure, including at least one organic layer, at least one metal growth layer grown onto the organic layer, and at least one metal layer grown on the metal growth layer. The at least one
(Continued)

metal growth layer contains germanium. Various embodiments further relate to a method for producing the electronic structure.

4 Claims, 16 Drawing Sheets

(51) Int. Cl.
*H01L 51/10* (2006.01)
*H01L 51/44* (2006.01)
*H01L 51/56* (2006.01)

(52) U.S. Cl.
CPC ...... *H01L 51/5092* (2013.01); *H01L 51/5215* (2013.01); *H01L 51/56* (2013.01); *H01L 2251/301* (2013.01); *H01L 2251/303* (2013.01); *Y02E 10/549* (2013.01)

(56) References Cited

U.S. PATENT DOCUMENTS

| | | | | |
|---|---|---|---|---|
| 6,198,092 B1* | 3/2001 | Bulovic | ................ | B82Y 10/00 136/263 |
| 6,340,537 B1* | 1/2002 | Arai | ................... | H01L 51/5092 313/504 |
| 6,515,417 B1* | 2/2003 | McConnelee et al. | ................... | H01L 27/3211 313/504 |
| 6,686,263 B1* | 2/2004 | Lopatin | ............... | H01L 51/0021 438/257 |
| 6,794,061 B2 | 9/2004 | Liao et al. | | |
| 7,796,320 B2 | 9/2010 | Yang et al. | | |
| 2002/0110673 A1* | 8/2002 | Heydarpour | ...... | G02F 1/133305 428/209 |
| 2003/0127967 A1 | 7/2003 | Tsutsui et al. | | |
| 2003/0189401 A1* | 10/2003 | Kido | .................... | C07C 211/58 313/504 |
| 2004/0017151 A1* | 1/2004 | Kim | ................... | H01L 27/3246 313/504 |
| 2005/0017249 A1* | 1/2005 | Liu | ....................... | H01L 33/641 257/79 |
| 2006/0035398 A1* | 2/2006 | Ying | ...................... | H01L 33/42 438/30 |
| 2007/0285005 A1 | 12/2007 | Itai | | |
| 2008/0001529 A1* | 1/2008 | Park | ................... | H01L 51/5088 313/504 |
| 2008/0070137 A1* | 3/2008 | Yanus | ................. | G03G 5/0567 430/59.6 |
| 2012/0326136 A1* | 12/2012 | Chen | .................. | H01L 51/0013 257/40 |

FOREIGN PATENT DOCUMENTS

| | | |
|---|---|---|
| EP | 1030384 A1 | 8/2000 |
| EP | 1041654 A1 | 10/2000 |
| JP | 2000223273 A | 8/2000 |
| JP | 2008277669 A | 11/2008 |
| JP | 4696355 B2 | 6/2011 |
| KR | 1020030046327 | 6/2003 |
| WO | 0293662 A2 | 11/2002 |
| WO | 2012029750 A1 | 3/2012 |

OTHER PUBLICATIONS

International Search Report issued in PCT/EP2013/055665 dated Jun. 25, 2013.
N.Kaiser, "Review of the fundaments of thin-film growth", Applied Optics, vol. 41, Issue 16, pp. 3053-3060, Jun. 2002.
C.J.Lee et al., "Green top-emitting organic light emitting device with transparent Ba/Ag bilayer cathode", Appl. Phys. Lett.89, 2006, pp. 123501-1-123501-3.
R.B. Pode et al., Transparent conducting metal electrode for top emission organic light-emitting devices: Ca—Ag double layer, Appl. Phys. Lett. 84, No. 23, 2004, pp. 4614-4616.
S.Y. Kim, "Sr/Ag semsitransparent cathodes for top emission organic light-emitting devices", Thin Solid Films 517, pp. 2035-2038, Apr. 2009.
G.Gu et al., "Transparent organic light emitting devices", Appl. Phys. Lett. 68 (19), pp. 2606-2608, May 1996.
P.E.Burrows, "Semitransparent cathodes for organic light emitting devices", Journal of Applied Physics, vol. 87, No. 6, p. 3080-3085, Mar. 2000.
L.S. Hung, "Radiation damage and transmission enhancement in surface-emitting organic light-emitting diodes", Thin Solid Films 410, pp. 101-106, Jan. 2002.
W. Chen et al., "Ultra-thin ultra-smooth and low-loss silver films on a germanium wetting layer", Optics Express, vol. 18, No. 5, pp. 5124-5134, 2010.
Logeeswaran VJ et al., "Ultrasmooth Silver Thin Films Deposited with a Germanium Nucleation Layer", Nanoletters 2009,9 (1), pp. 178-182, 2008.
P. Melpignano et al., "E-beam deposited ultra-smooth silver thin film on glass with different nucleation layers: An optimization study for OLED micro-cavity application", Organic Electronics 11, pp. 1111-1119, 2010.
Chinese Office Action based on application No. 2013800158362 (6 pages + 5 pages English translation) dated Dec. 10, 2015 (for reference purpose only).
Korean Office Action based on Application No. 10-2014-7029371(4 Pages and 4 pages of English translation) dated Mar. 2, 2016 (Reference Purpose Only).
Korean Office Action based on application No. 10-2014-7029371 (4 pages + 5 pages English translation) dated Sep. 5, 2016 (for reference prupose only).

\* cited by examiner

FIG 9
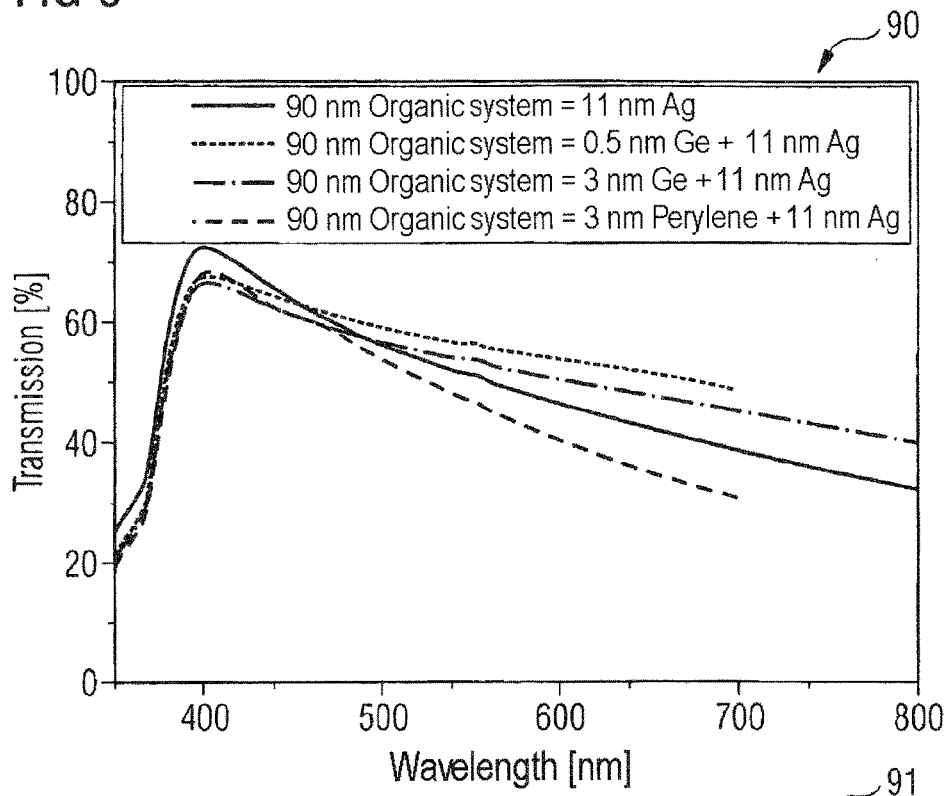
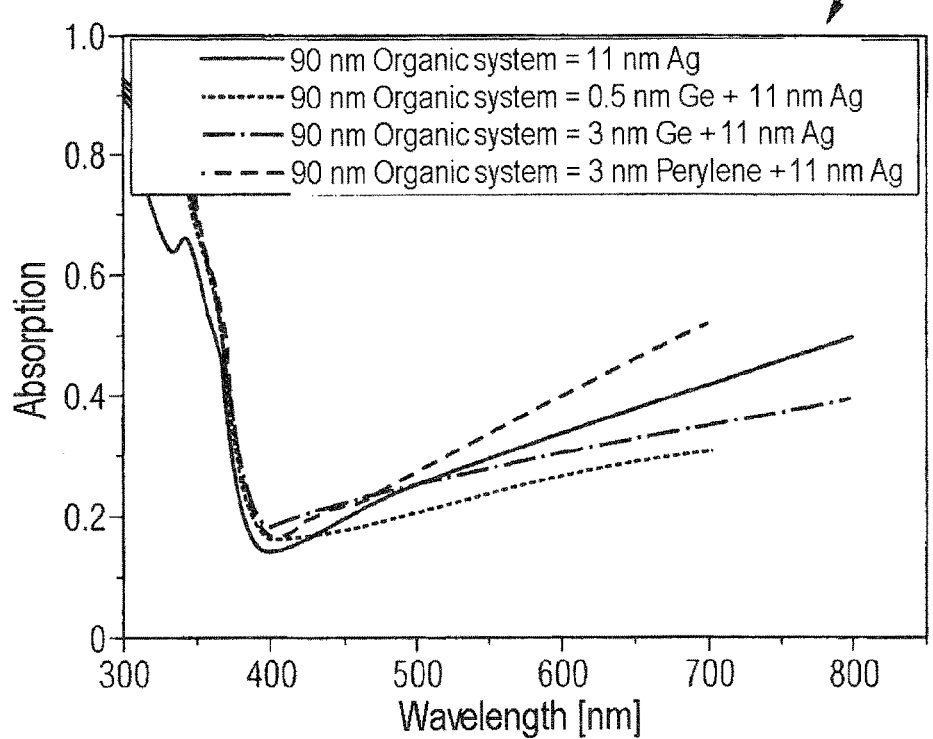

ELECTRONIC STRUCTURE HAVING AT LEAST ONE METAL GROWTH LAYER AND METHOD FOR PRODUCING AN ELECTRONIC STRUCTURE

RELATED APPLICATIONS

The present application is a national stage entry according to 35 U.S.C. §371 of PCT application No.: PCT/EP2013/055665 filed on Mar. 19, 2013, which claims priority from German application No.: 10 2012 204 432.9 filed on Mar. 20, 2012, and is incorporated herein by reference in its entirety.

TECHNICAL FIELD

Various embodiments relate to an electronic structure and to a method for producing such an electronic structure.

BACKGROUND

Electronic structures including a conductive layer structure are known. A conductive layer structure serves, for example, as a cathode contact in transparent OLED (organic light-emitting diode) components. Such an application usually requires two transparent electrodes, for example a transparent ITO (indium tin oxide) anode for hole injection and a transparent Ag (silver) cathode for electron injection. It is known for the Ag cathode to be thermally vapor-deposited onto organic electron transport layers as an Ag film by means of PVD (physical vapor deposition), for example.

According to N. Kaiser et al., Applied Optics, Vol. 41, Issue 16, pp. 3053-3060 (2002), the growth of thin metal films can be characterized by the formation of nuclei and by the growth behavior. In this case, depending on the interatomic interactions between surface atoms on the interface of a surface species to be coated with a metal film and so-called adatoms, the progressively absorbed atoms of the metal film on the surface atoms of the surface to be coated, to a first approximation, a distinction is made between three growth models:

In accordance with the Frank-van der Merwe model (layer growth), new layers grow homogeneously monolayer by monolayer on a surface. The interatomic interaction between surface atoms and adatoms is greater than the interaction between adjacent adatoms. A surface which fulfils this condition is a good so-called adhesion promoter for a given adatom.

In accordance with the Volmer-Weber model (island growth), the adatoms grow in an island-like fashion. The interatomic interaction between adjacent adatoms is greater than that between adatoms and surface atoms.

In accordance with the Stranski-Krastanov model (layer growth and island growth), the interatomic interaction between the surface atoms and the adatoms and thus the adhesion on the first monolayer of the adatoms is initially higher than on the pure surface. As a result, at least one completely closed monolayer forms initially. Starting from a critical layer thickness, island-like growth upward takes place, since the interatomic interaction between the adjacent adatoms increases with the layer thickness of the metal film.

The three growth models can be described, to a first approximation, thermodynamically via the interplay between contact angle and surface energies by means of what is referred to as Young's equation.

$$\gamma_B = \gamma^* + \gamma_A \cos\phi \quad (1)$$

In this case, $\gamma_B$ denotes the surface energy of the surface species to be coated, $\gamma_A$ denotes the surface energy of the metal film to be applied, $\gamma^*$ denotes the interfacial energy between the surface to be coated and the metal film surface, and $\phi$ denotes the contact angle between $\gamma_A$ and $\gamma^*$.

For the Frank-van der Merwe model, it holds true that for every position $\phi=0$ and therefore $$\gamma_B > \gamma^* + \gamma_A \quad (2)$$

For the Volmer-Weber model, it holds true that for every position (homoepitaxial systems) $\phi>0$ and therefore $$\gamma_B < \gamma^* + \gamma_A \quad (3)$$

For the Stransky-Krastanov model, it holds true that firstly $\phi=0$ and thus $$\gamma_B > \gamma^* + \gamma_A \quad (2)$$

and finally, starting from a critical position, if the interfacial energy $\gamma^*$ also increases as the layer thickness increases, $\phi>0$ and thus $$\gamma_B < \gamma^* + \gamma_A \quad (3)$$

It is known that metal films in heteroepitaxial systems grow on surfaces in principle in an island-like fashion in accordance with the Volmer-Weber model.

Such islands of the adatoms on the surface are initially transparent to radiation in the visible wavelength range and in the infrared range. Upon reaching the so-called percolation layer thickness, thus the layer thickness at which the islands have grown in such a way that they touch one another, the metal films form continuous layer structures. This process is also referred to as coalescence. The layer structures of the metal films are initially transparent to radiation in the visible wavelength range and reflect in the infrared range. As the layer thickness increases, however, the radiation in the visible wavelength range is also reflected; therefore, the transparency of the metal film decreases significantly as the layer thickness increases.

If there are pronounced interatomic interactions between the adjacent adatoms, the island growth is also additionally fostered by intrinsic thermal diffusion. Such thermal diffusion processes can be described by means of the Arrhenius equation.

$$D = D_0^* \exp^{[-\Delta E/kT]} \quad (4)$$

In this case, D denotes the diffusion coefficient at a given temperature T (in kelvins), $D_0$ denotes the so-called pre-exponential factor, k denotes the Boltzmann constant, and $\Delta E$ denotes the activation energy necessary for the diffusion process.

For a sufficiently low temperature, it holds true that $\Delta E>kT$, and the activation energy for the diffusion process ($\Delta E$) is thus greater than the thermal energy of the surface (kT); this makes the diffusion more difficult and the adatoms adhere to their adsorption sites on the surface.

However, if it holds true that $\Delta E<kT$, and if the activation energy for the diffusion process ($\Delta E$) is thus less than the thermal energy of the surface (kT), then the adatoms can move relatively freely on the surface; this is referred to as increased diffusion mobility in this case. In this case, the probability of a collision of two adatoms is higher than for the case where $\Delta E>kT$. If two adatoms collide with one another, then a dimer can arise which remains as a stable nucleation nucleus; such nuclides are nuclei for island formation and therefore additionally foster island growth.

In this case, what should be regarded as disadvantageous about the known electronic structures including a conductive layer structure is the circumstance that organic layers suitable for organic light-emitting diodes (OLEDs), for example, are often poor adhesion promoters for thin metal films, for example for thin Ag cathode films. The island growth exhibited by metals is additionally fostered thereby. Such island growth limits the lateral conductivity of the Ag cathode films and prevents efficient homogeneous electron injection. This in turn can disadvantageously affect the component performance, in particular the efficiency of an OLED, for example. It is only as the layer thickness increases that the islands combine (coalescence) and the lateral conductivity increases starting from the so-called percolation layer thickness. However, if the layer thickness increases, absorption and reflection processes for the visible wavelength range are increasingly fostered and the transparency of an OLED, for example, decreases significantly.

This can be attributed to a relatively high interatomic interaction between two adjacent adatoms, for example silver (Ag), and, in comparison therewith, lower interatomic interactions between an adatom and a surface atom, for example of an organic compound. For a pronounced interatomic interaction between an adatom and a surface atom, illustratively a relatively high surface energy $\gamma_B$ of the surface species is provided. The surface energy $\gamma_B$ of the atoms of the surface species increases material-specifically with the bond energy of the respective atoms. The bond energy of the atoms is proportional to the respective specific sublimation temperature. However, OLED-suitable organic surfaces, in particular, are generally distinguished precisely by relatively low sublimation temperatures and accordingly relatively low molecular bond energies and thus by low surface energies $Y_B$.

Various conventional electronic structures include a transparent conductive layer structure. In this regard, a description is given of so-called stacked electrode concepts in the system gold (Au)-aluminum (Al). In this regard, U.S. Pat. No. 7,796,320 B2 describes stacked electrodes, for example of the composition Al/Au, Au/Al/Au, Al/Cu, Cu/Al/Cu, Cu/Ag, Ag/Cu, Au/Ag, Ag/Au, Ca/Ag, Ag/Ca and Cr/Au. From the compositions described in U.S. Pat. No. 7,796,320 B2, the three-layer construction Au/Al/Au is described as the stack compound having the best transmission properties. However, what is problematic about the construction of the layer structure as described in U.S. Pat. No. 7,796,320 B2 is the high complexity of the three-layer structure of the stacked electrode and the high production outlay associated therewith.

C. J. Lee et al., R., Appl. Phys. Lett. 89 (2006), 123501, describe, for example, a top emitting OLED component in which a layer of barium (Ba) having a layer thickness of 10 nm was deposited thermally on a 5 nm thick 2,9-dimethyl-4,7-diphenyl-1,10-phenanthroline (BCP) layer. What is problematic, however, is that barium (Ba) is an electrode material which reacts very sensitively to moisture and oxygen, as a result of which the usability and lifetime of a corresponding OLED component, for example, is significantly reduced.

R. B. Pode et al., Appl. Phys. Lett. 84 (2004), 4614-4616, investigated double-layer metal cathodes for top emitting OLED components. Thermally vapor-deposited calcium (Ca), magnesium (Mg), or lithium fluoride (LiF) in each case in combination with silver (Ag) and aluminum (Al) were investigated in this case. A high transmission in conjunction with a relatively low sheet resistance was reported for layers of 10 nm calcium and 10 nm silver. However, calcium is an electrode material which reacts very sensitively to moisture and oxygen, as a result of which the usability and lifetime of an electronic component, for example of a corresponding OLED component, is significantly reduced.

S. Y. Kim et al., Thin Solid Films 517 (2009), 2035-2038 describe semitransparent cathodes having the layer sequence strontium (Sr) (having a layer thickness of 8 nm to 10 nm)/Ag (10 nm), which were thermally vapor-deposited. In this case, Sr was used as a so-called wetting promoter for improving the growth properties of the Ag film. A relatively high transmission in conjunction with a relatively low sheet resistance was achieved in this case, too. However, the percolation layer is attained only at relatively high layer thicknesses of the Ag film, the film not being completely closed or even coherent even at a layer thickness of 20 nm silver (Ag). However, at this Ag layer thickness, absorption and reflection processes for the visible wavelength range are already significantly fostered and the transparency of an OLED, for example, decreases significantly. Consequently, Sr is not suitable as a wetting promoter particularly for transparent electronic applications.

Furthermore, G. Gu, V. Bulovic et al., Appl. Phys. Lett. 68 (1996) 2606-2608; P. E. Burrows et al., J. Appl. Phys. 87 (2000), 3080; L. S. Hung et al., Thin Solid Films 410 (2002), 101), described thermally vapor-deposited, semitransparent metal films having low work functions to which transparent conductive oxides (such as e.g. ITO) were finally applied by means of sputtering techniques. However, application of electrode layers by sputtering, without further buffer layers, can lead to damage to the underlying layers, and thus requires additional complex production steps and therefore significantly increases the production outlay.

U.S. Pat. No. 6,794,061 B2 describes magnesium (Mg) cathodes vapor-deposited onto a wetting promoter layer. It is apparent that Mg cathodes have poor adhesion properties on organic layers. Al:Mg or Ag:Mg alloys made it possible to improve the wetting and to deposit more homogeneous layers. However, pure Mg cathodes have the advantage of low work functions (~3.7 eV) that are no longer attained by means of the alloys. All metals or metal compounds of main groups 1 to 15 of the periodic system having atomic numbers of greater than or equal to 19 were taken into account as wetting promoters. However, magnesium (Mg) is an electrode material which reacts very sensitively to oxygen and, moreover, is very highly inflammable. As a result, the usability and lifetime of an electronic structure, for example of an OLED component, is significantly reduced and production is significantly more complex.

Germanium (Ge) as a wetting promoter was described for silver atoms on inorganic silicate or $SiO_2$ surfaces in Weiqiang Chen et al., OPTICS EXPRESS 18 (2010), 5124; and in Logeeswaran V J et al., NANOLETTERS 9 (2009), 178-182. In this regard, a homogeneous coating without pronounced island formation of the silver atoms is achieved according to Weiqiang Chen et al. by virtue of the fact that the bond energy between Ag—Ge is higher than for Ag—Ag (Ag—Ge $\Delta H=174.5\pm21$ kJ/mol and Ag—Ag $\Delta H=162.9\pm2.9$ kJ/mol). Higher bond energies reduce surface diffusion processes and thus island-like Volmer-Weber growth. In this regard, Logeeswaran V J et al. report that the activation energy for a surface diffusion of Ag atoms on Ge surfaces is 0.45 eV, while it is only 0.32 eV on $SiO_2$ surfaces. Consequently, Logeeswaran V J et al. show that a germanium film a few monolayers thick on the $SiO_2$ surface fosters large-area closed Frank-van der Merwe growth of thin Ag films. However, the investigations are restricted exclusively to inorganic $SiO_2$ surfaces. However, as an insulator, $SiO_2$ is unsuitable as conductive surface species in electronic structures, in particular as electrode surface species for electrically conductive structures, and is thus not suitable for an application in an electrically active region. Moreover, no restricted production conditions for film deposition corresponding to organic surfaces hold true for insensitive inorganic $SiO_2$ surfaces.

For OLED applications, the transparent Ge/Ag layer sequence with an Ag film closed over a large area by the germanium nucleation has been described hitherto only as an anode concept likewise on borosilicate glass surfaces (P. Melpignano, C. Cioarec, R. Clergereaux, N. Gherardi, C. Villeneuve, L. Datas, Organic Electronics 11 (2010), 1111-1119). In this case, on borosilicate glass, a 5 nm thick germanium nucleation film and finally a 25 nm thick semitransparent Ag film as anode were thermally vapor-deposited. Finally, a blue OLED with bottom emission was deposited on said anode. However, the electrode described is only semitransparent and in turn deposited on an $SiO_2$ or borosilicate glass surface, which in turn, as an insulator, is unsuitable as a surface in active regions of electronic structures.

Typical metal films, for example silver films (also called Ag films hereinafter), of electronic structures according to the related art which were applied to a surface are therefore completely closed only at relatively large layer thicknesses. However, an increasing layer thickness significantly limits the transparency of the electronic structure. Other proposals are very complex in terms of production and characterized by complicated layer constructions or have only a very limited lifetime and/or usability and/or component performance in electronic structures on account of disadvantageous material properties.

A conceivable increase in the deposition rate of, for example, the PVD process used for application for depositing the respective metal film on the respective surface, which makes it possible to produce a multiplicity of nucleation nuclei on the surface already in the first monolayers, is possible only to a very small, insufficient extent, however, taking customary production conditions into account.

Reducing the temperature of the substrate surface in order to reduce the diffusion processes on the substrate surface is also possible only to a very limited and therefore insufficient extent taking customary production conditions into account.

SUMMARY

Various embodiments provide an electronic structure in which a transparent conductive layer structure having a low sheet resistance is achieved in a simple manner.

Furthermore, various embodiments provide an electronic structure in which the homogeneity of a metal film of the layer structure of the electronic structure can be improved in a simple manner.

In order to achieve a thin, closed, homogeneous and transparent metal film in the case of island-like Volmer-Weber growth of a given metal, provision is made for reducing the percolation layer thickness of the respective metal film already in the first monolayers of the metal film. This is achieved in various embodiments by maximizing the number of islands per unit area by virtue of the surface energy $\gamma_B$ of the surface being increased for example by a plasma treatment or by the introduction of a so-called wetting promoter or else designated as a so-called wetting interlayer (or else designated as adhesion promoting layer, seed layer, wetting layer).

In various embodiments, an electronic structure is provided, this electronic structure having at least one organic layer and at least one metal growth layer grown onto the organic layer and at least one metal layer grown on the metal growth layer, wherein at least one metal growth layer contains germanium.

Illustratively, the layer structure of the electronic structure consisting of at least one organic layer and at least one metal growth layer grown onto the organic layer, said at least one metal growth layer containing germanium, and at least one metal layer grown on the metal growth layer can be used in various embodiments, for example in an optically transparent light-emitting component, to put it another way for example in a top and/or bottom emitter, for example in a transparent organic light-emitting diode, wherein the electronic structure in various embodiments can significantly improve the transparency of the light-emitting component. This can be achieved in various embodiments.

In various embodiments, the germanium-containing metal growth layer serves as a wetting promoter for the metal layer to be deposited onto the organic layer and enables a percolation of the metal layer already in the first monolayers. In various embodiments, a transparent, homogeneous and conductive metal film having a low sheet resistance is achieved as a result.

In other words, various embodiments provide a transparent conductive layer sequence for transparent electronics applications. Illustratively, this involves depositing, for example, a few nanometers thin Ag cathode film (metal film) on a charge carrier transporting/injecting organic layer on a so-called germanium interlayer (metal growth layer) as wetting promoter. In other words, for example, an electronic structure including a first electrode, an organic layer and a Ge/Ag cathode film is provided as a result. In this case, the Ge/Ag cathode film should be understood as an Ag film grown on a germanium interlayer. The thin Ge/Ag cathode film provided in various embodiments has, for example, a homogeneously closed Ag cathode film surface and exhibits a high transparency for the visible wavelength range. The Ge/Ag cathode film has a low sheet resistance. This transparent layer combination can be employed for example as a cathode contact in transparent organic light-emitting diode (OLED) components. For such an application, by way of example, two transparent electrodes, e.g. a transparent ITO anode for hole injection and a transparent Ag cathode for electron injection, can be provided in various embodiments.

In one configuration, the metal growth layer can be a pure germanium growth layer (in other words, the metal growth layer can consist of 100% pure germanium). In this configuration, the germanium growth layer can have a layer thickness in a range of approximately 0.1 nm to approximately 10 nm, for example a layer thickness in a range of approximately 0.1 nm to approximately 3 nm, for example a layer thickness in a range of approximately 0.1 nm to approximately 1 nm.

In one configuration, the metal growth layer can be a metallic multi-substance system, for example an alloy. Said alloy can be, for example, an alloy of the system germanium-silver in this case, the alloy can have a composition including a substance amount proportion of silver in a range of approximately 0.1% and approximately 99.999%. The alloy can for example also be an alloy of the system germanium-gold and, in this case, the alloy can have a composition including a substance amount proportion of gold in a range of approximately 0.1% and approximately 99.999%. The alloy can for example also be an alloy of the system germanium-copper. In this case, the alloy can have for example a composition having a substance amount proportion of copper in a range of approximately 0.1% and approximately 99.999%.

On account of the very low germanium proportions possible in absolute terms and in comparison with 100% germanium growth layers, such a multi-substance system layer in accordance with various embodiments has the potential of minimizing the absorption by the germanium. In the case of multiple passes of the light within the optical cavity of an optoelectronic component, for example of an OLED, it may be of importance how the non-transmitted light portions are divided between absorption and reflection. Reflected portions can be transmitted after a further cavity pass, while absorbed portions are lost for transmission and thus external emission. Correspondingly, low absorption may be of very high importance in comparison with transmission and reflection. Especially for components which are not intended to be embodied as transparent (e.g. for a top emitter or for a bottom emitter), the multi-substance system electrodes can therefore be advantageous for example even if they offer lower absorption with at the same time somewhat reduced transmission.]

In another configuration, alternatively, the metal growth layer of the electronic structure can contain germanium oxide or consist for example of germanium oxide.

In a further configuration, the metal growth layer can be germanium or consist thereof.

The electronic structure can include for example a metal growth layer which can be embodied as a monolayer.

The metal growth layer can have for example a layer thickness in a range of approximately 0.1 nm and approximately 10 nm.

In a further configuration, the metal growth layer can have a layer thickness of 0.1 nm.

In another configuration, the metal growth layer can have a layer thickness of 0.5 nm. A particularly good transparency and a particularly low sheet resistance can be obtained for these layer thicknesses.

In another configuration, the metal growth layer can have a layer thickness of 3 nm. In another configuration, the metal growth layer can also have a layer thickness of 10 nm. Good results with regard to increasing the transparency of the electronic structure were likewise obtained for these layer thickness ranges.

In another configuration, the metal layer grown on the metal growth layer can contain silver. By way of example, the metal layer grown on the metal growth layer can be embodied as a silver cathode. The metal layer grown on the metal growth layer can be embodied as a transparent silver cathode film (Ag cathode film).

In another configuration, the electronic structure can furthermore include a second metal growth layer containing germanium.

In another configuration, the electronic structure can be designed as a transparent electronic component. By way of example, the electronic structure can be designed as a light-emitting electronic component, for example as a light-emitting electronic semiconductor component.

Illustratively, the light-emitting electronic semiconductor component can be designed in various embodiments, for example as a light-emitting diode (LED), for example as an organic light-emitting diode (OLED). In this case, the organic light-emitting diode can be embodied for example as transparent at least in regions. In various embodiments, additionally or alternatively, an organic light-emitting diode can include a transparent top contact. In this case, the transparent top contact can include a metal growth layer containing germanium, and can include a metal layer grown onto the metal growth layer, said metal layer containing silver, in a further embodiment, the organic light-emitting diode can also include a transparent center contact. In this case, by way of example, the transparent center contact can include a metal growth layer containing germanium, and can include a metal layer grown onto the metal growth layer, said metal layer containing silver.

In another configuration, the organic light-emitting diode can include a transparent top contact and a transparent center contact.

In another configuration, the organic light-emitting diode can be designed with at least one dielectric layer which can serve as an antireflection coating.

In another configuration the organic light-emitting diode can be designed as a top emitting organic light-emitting diode. The latter can include a transparent top contact, for example. The top contact can include for example a metal growth layer containing germanium, and can include a metal layer grown onto the metal growth layer, said metal layer containing silver. A lower viewing angle dependence of the top emitting organic light-emitting diode can additionally be achieved as a result. In addition, in various embodiments, white-emitting top emitters can be made possible in a simple manner.

In another configuration, the organic light-emitting diode can include a transparent center contact. The transparent center contact can include for example a metal growth layer containing germanium and can include a metal layer grown onto the metal growth layer, said metal layer containing silver.

In another configuration, the organic light-emitting diode can be designed as a bottom emitting organic light-emitting diode. The organic light-emitting diode can include a transparent center contact, for example. The transparent center contact can include for example a metal growth layer containing germanium and can include a metal layer grown onto the metal growth layer, said metal layer containing silver.

In another configuration, the organic light-emitting diode can be designed for example with a charge generation layer (CGL). The charge generation layer can include for example a metal growth layer containing germanium. The metal layer grown onto the metal growth layer can contain silver, for example.

In another configuration, the organic light-emitting diode can be embodied as flexible at least in regions.

The organic light-emitting diode can be designed for example in such a way that it emits white light.

In another configuration, the organic light-emitting diode can be embodied at least in regions as a passive (non-luminous) display.

In a further configuration, the electronic structure can be designed as a conductor track. Such a conductor track can be embodied as transparent for example at least in regions.

In a further configuration, the electronic structure can be designed as an electrode. Such an electrode can be embodied as transparent for example at least in regions. In this case, the electrode can be an intermediate electrode, for example. The intermediate electrode can be embodied as transparent for example at least in regions.

In a further configuration, the electronic structure can be designed as a transistor. The transistor can be embodied as transparent for example at least in regions.

In a further configuration, the electronic structure can be designed as an electronic circuit. The electronic circuit can be embodied as transparent for example at least in regions.

In a further configuration, the electronic structure can be designed as a solar cell. In this case, the solar cell can be embodied as a semiconductor solar cell, for example. In various embodiments, the semiconductor solar cell can be a II-VI semiconductor solar cell, or a III-V semiconductor solar cell or a I-III-VI semiconductor solar cell.

The solar cell can be embodied as an organic solar cell, for example. In a further embodiment, the solar cell can be embodied as a silicon solar cell.

In another configuration, the electronic structure can include at least one growth layer for organic materials; and at least one organic layer grown on the growth layer.

In another configuration, the at least one growth layer can contain germanium.

In another configuration, the organic layer can be embodied as an electron transport layer.

Various embodiments provide an electronic component including at least one electronic structure according to various embodiments. In various embodiments, the electronic component can be designed as a display, for example. The configurations of the electronic structure correspondingly apply, insofar as expedient, to the electronic component.

In various embodiments, a light-emitting component can be embodied as an organic light-emitting diode (OLED) or as an organic light-emitting transistor. In various embodiments, the light-emitting component can be part of an integrated circuit.

Furthermore, it is possible to provide a plurality of light-emitting components, for example accommodated in a common housing.

Various embodiments provide a method for producing an electronic structure. The method can include forming at least one organic layer and forming at least one metal growth layer grown onto the organic layer, and forming at least one metal layer grown on the metal growth layer; wherein the at least one metal growth layer contains germanium.

The configurations of the electronic structure correspondingly apply, insofar as expedient, to the method for producing an electronic structure.

Various embodiments furthermore provide a method for producing an electronic structure. The method can include forming at least one growth layer for organic materials; and forming at least one organic layer grown on the growth layer, wherein the at least one growth layer contains germanium.

The configurations of the electronic structure correspondingly apply, insofar as expedient, to the method for producing an electronic structure.

Furthermore, various embodiments furthermore provide a method for producing an electronic component. In this case, the method can include forming at least one electronic structure according to one of the type described above, wherein the electronic component is formed as a display.

The configurations of the electronic structure correspondingly apply, insofar as expedient, to the method for producing an electronic component including the electronic structure.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 9 shows a diagram illustrating the transmission of light through a light-emitting reference component as a function of the wavelength of the emitted light in accordance with various embodiments in comparison with conventional embodiments;

DETAILED DESCRIPTION

In the following detailed description, reference is made to the accompanying drawings, which form part of this description and show for illustration purposes specific embodiments in which the disclosure can be implemented. In this regard, direction terminology such as, for instance, "at the top", "at the bottom", "at the front", "at the back", "front", "rear", etc. is used with respect to the orientation of the figure(s) described. Since components of embodiments can be positioned in a number of different orientations, the direction terminology serves merely for illustration and is not restrictive in any way whatsoever. It goes without saying that other embodiments can be used and structural or logical changes can be made, without departing from the scope of protection of the present disclosure. It goes without saying that the features of the various embodiments described herein can be combined with one another, unless specifically indicated otherwise. Therefore, the following detailed description should not be interpreted in a restrictive sense, and the scope of protection of the present disclosure is defined by the appended claims. The schematic drawings in the figures serve merely for illustrating the inventive concept and are not depicted in a manner true to scale.

In the context of this description, the terms "connected" and "coupled" are used to describe both a direct and an indirect connection and a direct or indirect coupling. In the figures, identical or similar elements are provided with identical reference signs, insofar as this is expedient.

Figure 1:
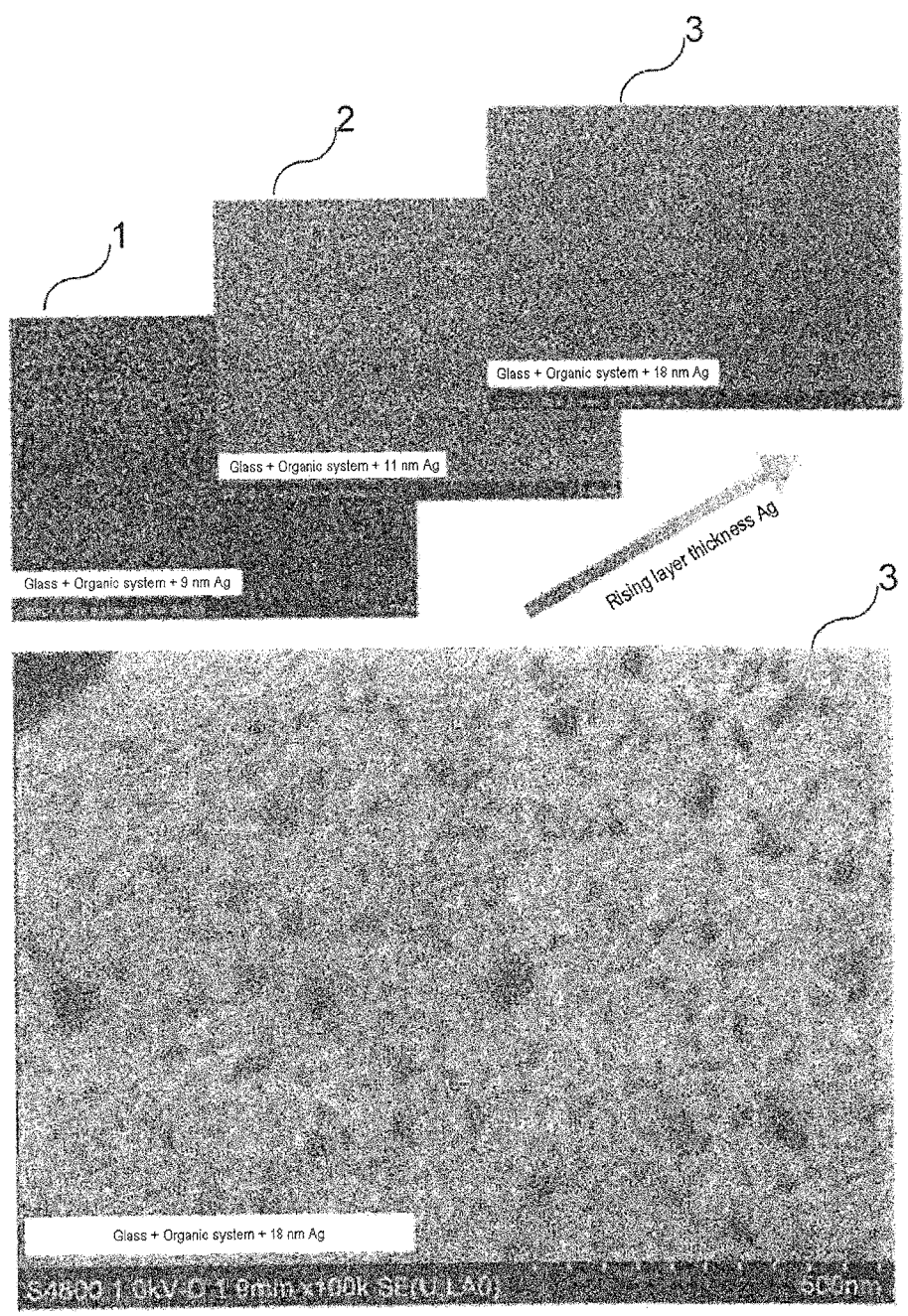
FIG. 1 shows SEM micrographs of conventional Ag cathode films of electronic structures having different layer thicknesses, on an n-doped organic support.

FIG. 1 shows SEM micrographs of Ag cathode films of electronic structures having different layer thicknesses according to the related art, on an n-doped organic support. In order to illustrate an embodiment of a conventional electronic structure having a thin Ag cathode film, an organic electron injection/transport layer having a layer thickness of 90 nm was thermally vapor-deposited onto a glass by means of PVD (physical vapor deposition). Afterward, in each case an Ag cathode having the layer thicknesses 9 nm (first SEM micrograph 1), 11 nm (second SEM micrograph 2) and 18 nm (third SEM micrograph 3) was likewise thermally vapor-deposited by means of PVD. Typically commercially available organic electron injection/transport layers are, for example, 8-hydroxyquinolinolato-lithium (Liq), 2,2',2"-(1,3,5-benzinetriyl)-tris(1-phenyl-1-H-benzimidazole) (TPBi), 2-(4-biphenylyl)-5-(4-tert-butylphenyl)-1,3,4-oxadiazole, butyl-PBD or 2-(4-(tert-butylphenyl)-5-(4-biphenylyl)-1,3,4-oxadiazole (BCP), 4,7-diphenyl-1,10-phenanthroline (Bphen), bis(2-methyl-8-quinolinolato-N1,08) (1,1'-biphenyl-4-olato)aluminum (BAlq), 1,3-bis[2,2'-bipyridine-6-yl)-1,3,4-oxadiazo-5-yl]-benzene (Bpy-OXD), 6,6'-bis[5-(biphenyl-4-yl)-1,3,4-oxadiazo-2-yl]-2,2'-bipyridyl (BP-OXD-Bpy), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 2,9-bis(naphthalen-2-yl)-4,7-diphenyl-1,10-phenanthroline (NBphen), 2,7-bis[2-(2,2'-bipyridin-6-yl)-1,3,4-oxadiazo-5-yl]-9,9-dimethyl-fluorene (PbyFOXD), 1,3-bis[2-(4-tert-butylphenyl)-1,3,4-oxadiazo-5-yl]benzene (OXO-7), tris(2,4,6-trimethyl-3-(pyridin-3-yl)phenyl)borane (3TPYMB), 1-methyl-2-(4-(naphthalen-2-yl)phenyl)-1H-imidazo[4,5f][1,10]phenanthroline (2-NPIP), 2-phenyl-9,10-di(naphthalen-2-yl)-anthracene (PADN), 2-(naphthalen-2-yl)-4,7-diphenyl-1,10-phenanthroline (HN-Bphen), phenyl-dipyrenylphosphine oxide (POPy2), 3,3',5,5'-tetra[(m-pyridyl)-phen-3-yl]biphenyl (BP4mPy), 1,3,5-tri[(3-pyridyl)-phen-3-yl]benzene (TmPyBP), 4,4'-bis(4,6-diphenyl-1,3,5-triazin-2-yl)biphenyl (BTB). Alongside inorganic electron injection/transport layers such as, for example, lithium fluoride (LiF), calcium (Ca) or barium (Ba), it is also possible to use organic electron injection layers such as, for example, abovementioned n-doped organic electron injection/transport layers in combination with alkali metals such as, for example, lithium (Li) or cesium (Cs) or else in combination with organic compounds such as BEDT-TTF, for example. Furthermore, the abovementioned organic electron injection/transport layers can be used in combination with salts such as, for example cesium carbonate ($Cs_2CO_3$) or with organometallic compounds such as, for example, cobaltocene ($CoCp_2$). These materials can be used in the same way in the embodiments described below.

Figure 2:
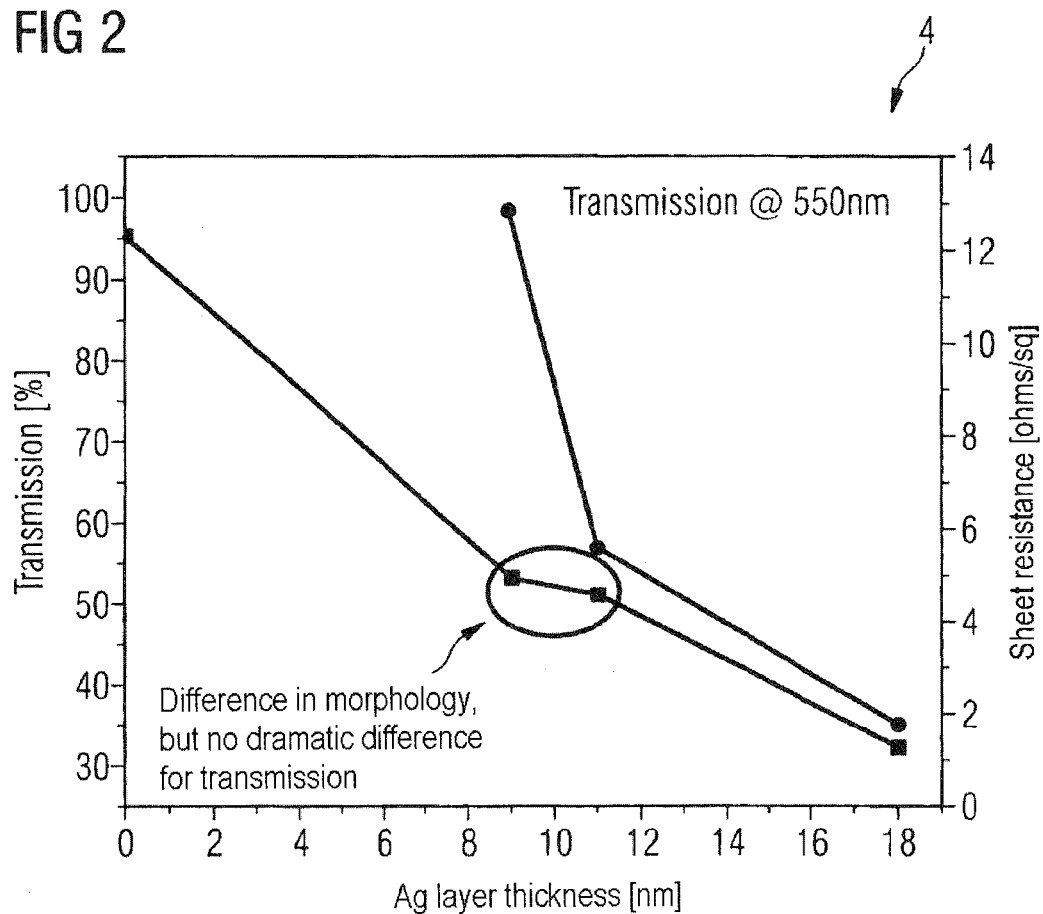
FIG. 2 shows a diagram of the transmission and the sheet resistance for different layer thicknesses of conventional Ag films on an n-doped organic support.

The investigated Ag layers having the abovementioned layer thicknesses in a conventional electronic structure do not include closed Ag cathode films, but rather percolated, island-like structures on the organic layers. The Ag cathode film exhibits Volmer-Weber growth. Such island growth of the Ag cathode film increases the sheet resistance of the Ag cathode and limits efficient homogeneous electron injection. This in turn disadvantageously affects the performance of the electronic structure, in particular the efficiency, for example of a transparent OLED. It is only as the layer thickness increases that the discernible islands combine (coalescence). However, if the layer thickness increases, absorption and reflection processes for the visible wavelength range are fostered and the transparency of the OLED decreases. The dependence of the sheet resistance and of the transmission as a function of the Ag layer thickness is illustrated in a diagram in FIG. 2, which shows a diagram of the transmission versus the/and of the sheet resistance for different layer thicknesses of conventional Ag films on an n-doped organic support.

Figure 3:
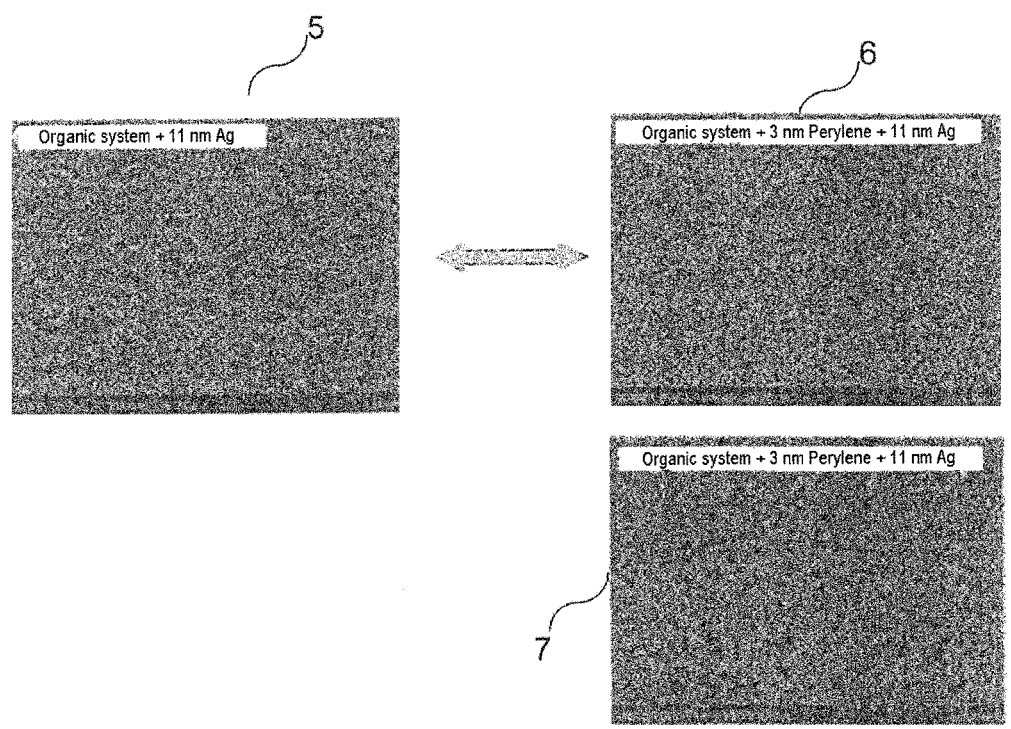
FIG. 3 shows SEM micrographs of a conventional Ag cathode film of an electronic structure, applied perylene as an organic wetting promoter.

FIG. 3 shows SEM micrographs (first SEM micrograph 5, second SEM micrograph 6, and third SEM micrograph 7) of an Ag cathode film of a conventional electronic structure, wherein applied perylene was investigated with regard to its properties as an organic surface for metal films. Perylene is a further compound which is used as a typical organic electron injection/transport layer in the field of OLEDs.

However, the SEM micrographs do not show significant improvement compared with other OLED-typical organic electron injection/transport layers. The Ag cathode film has percolated structures at a layer thickness of 11 nm on a 3 nm thick perylene surface. However, the Ag cathode film is recognizably not homogeneously closed and exhibits insulating trench profiles. As described above, homogeneously closed layer growth of the adatoms is fostered by higher surface energies of the substrate. Typical, conventional organic electron injection/transport layers for OLEDs, for example, have poor wetting properties for example for Ag cathode films. The surface energy of the organic substrate is too low to enable closed transparent Ag cathode films. As a rule of thumb, it holds true that: the surface energy of the vapor-deposited film increases with the bond energy of the material species of the film, the bond energy increasing with the sublimation temperature thereof. Particularly OLED-suitable organic materials, for example organic electron injection/transport layers, are distinguished by relatively low bond energies in general and precisely also in comparison with metals. As a result, these organic materials can be evaporated at lower sublimation temperatures, but have only low surface energies that are not suitable for homogeneously adsorbing metal films applied to these organic materials. The sublimation temperature of perylene, for example, is approximately 400° C. at a pressure of $3\times10^{-7}$ mbar. The transparency at a wavelength of 550 nm is only approximately 46%. The Ag cathode film has a high sheet resistance of 15.0 ohms/squ. FIG. 9 illustrates corresponding transmission measurements (in a transmission diagram 90) and absorption measurements (in an absorption diagram 91). Perylene is therefore not suitable as a substrate or as a wetting promoter for Ag adatoms, for example, in particular for application in transparent layers for OLEDs. Consequently, even by using a phenylene layer it is not possible to provide an electronic structure in which a transparent, conductive, homogeneous layer structure having a low sheet resistance is achieved in a simple manner.

Figure 4:
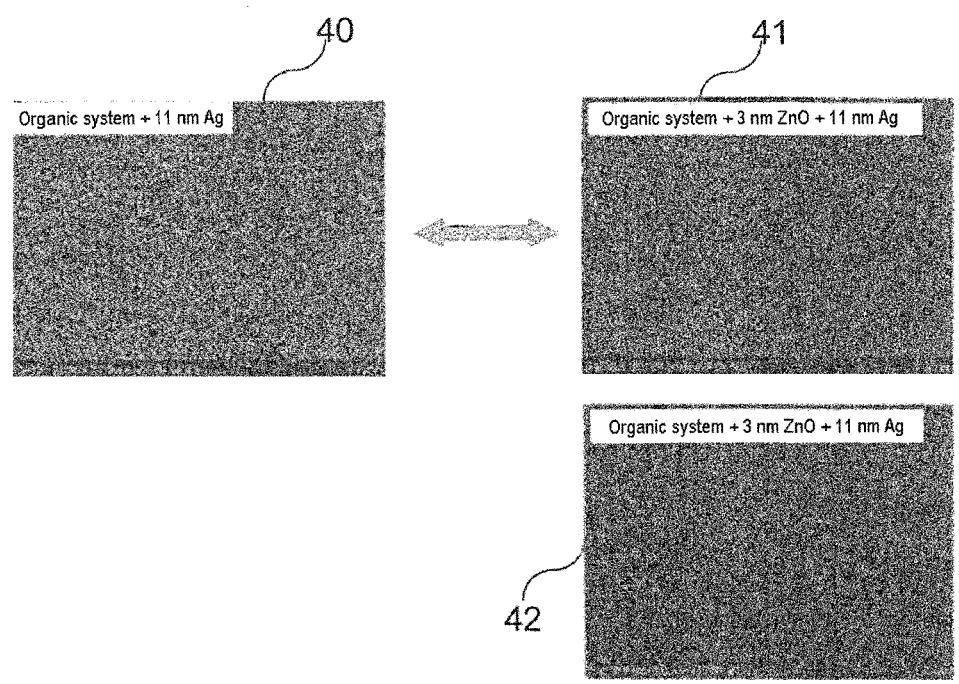
FIG. 4 shows SEM micrographs of an Ag cathode film of a conventional electronic structure, applied to a ZnO layer as a wetting promoter

FIG. 4 shows SEM micrographs (first SEM micrograph 40, second SEM micrograph 41, and third SEM micrograph 42) of an Ag cathode film of a conventional electronic structure, applied to a ZnO layer as a wetting promoter. In contrast to perylene, ZnO has a higher sublimation temperature of approximately 1700° C. at 3×10⁻⁶ bar. The SEM micrographs clearly show a more homogeneous wetting behavior of the Ag cathode films in comparison with the conventional organic supports investigated. Despite pronounced percolation of the Ag film for ZnO as a wetting promoter, however, the Ag cathode film is not completely homogeneously closed. Holes in the Ag cathode film are readily discernible as dark points in the bottom right image (third SEM micrograph 42). The ZnO layer thickness investigated as a wetting promoter is 3 nm in this case for comparison purposes—as in FIG. 2. The transparency at a wavelength λ=550 nm is approximately 53% and the sheet resistance of the Ag cathode is 7.0 ohms/squ. Corresponding transmission and absorption measurements are once again depicted in FIG. 9. Consequently, even by using ZnO as a wetting promoter, in particular for transparent applications such as for OLEDs, for example, it is not possible to provide an electronic structure in which a transparent, closed, homogeneous, conductive layer structure having a low sheet resistance is achieved in a simple manner.

Figure 5:
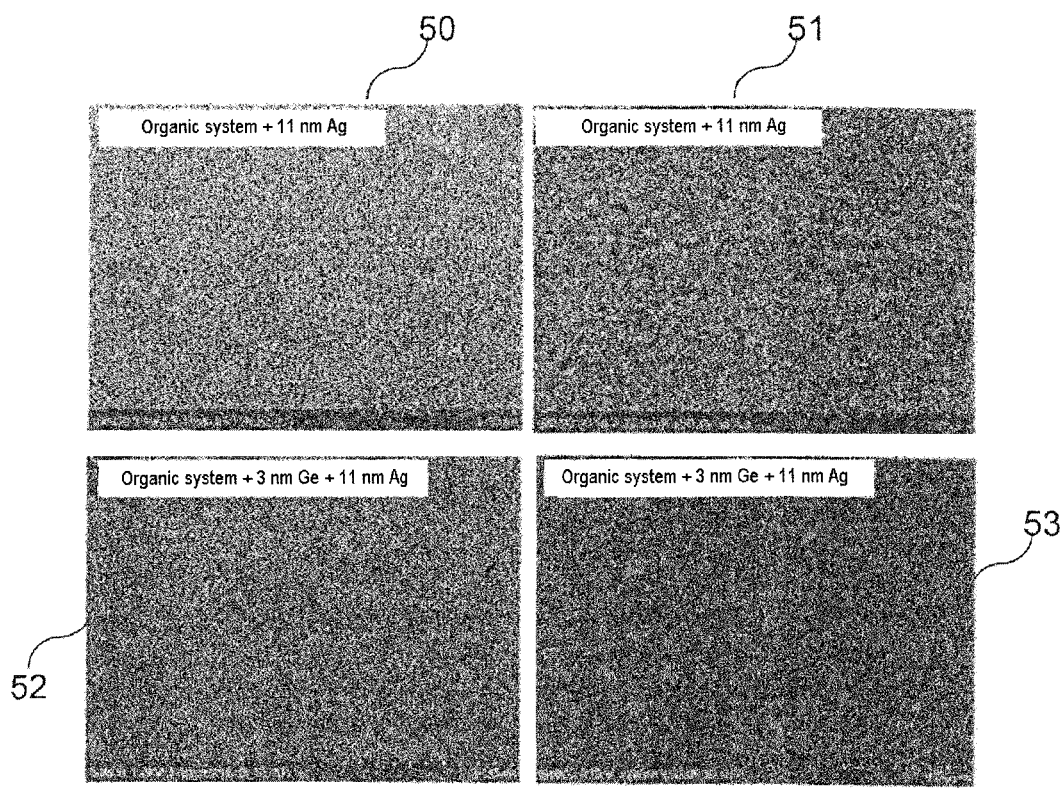
FIG. 5 shows SEM micrographs of Ag cathode films of electronic structures including germanium (Ge) as metal growth layer in accordance with various embodiments.

FIG. 5 shows SEM micrographs (first SEM micrograph 50, second SEM micrograph 51, third SEM micrograph 52, and fourth SEM micrograph 53) of Ag cathode films of electronic structures including germanium (Ge) as metal growth layer in accordance with various embodiments, wherein the electronic structure includes at least one metal growth layer and at least one metal layer grown on the metal growth layer, wherein the at least one metal growth layer contains germanium.

The construction of the electronic structure consists of an organic n-doped support, in other words an organic electron injection/transport layer, wherein, by way of example, the compounds and materials mentioned above in FIG. 1 can be used, a metal growth layer consisting of 0.5 nm Ge or 3 nm Ge and an Ag cathode film having a layer thickness of 11 nm. The SEM micrographs of the electronic structure are shown in the lower row in FIG. 5, see third SEM micrograph 52 and fourth SEM micrograph 53. In addition, the upper row in FIG. 5 shows for comparison SEM micrographs of electronic structures according to the related art without a metal growth layer, see first SEM micrograph 50 and second SEM micrograph 51. The SEM micrographs in the left column in FIG. 5 are on the scale of 5.00 μm. The SEM micrographs in the right column in FIG. 5 are on the scale of 1.00 μm. The Ag cathode film grows in the Volmer-Weber mode, but is completely homogeneously closed for a metal growth layer composed of germanium having the layer thickness of 0.5 nm and also having the layer thickness of 3 nm and exhibits no defect structures.

The provision of a metal growth layer composed of germanium as a wetting promoter thus makes it possible, for example for transparent applications such as for OLEDs, for example, to provide an electronic structure in which a transparent, closed, homogeneous, conductive layer structure having a low sheet resistance is achieved in a simple manner.

A particularly good wetting behavior of the tested Ag cathode films was observed for Ge layers a few monolayers thin.

The results of the transmission measurements for transmission at λ=550 nm and also the respective sheet resistances of conventional electronic structures without a wetting promoting layer and with a wetting promoting layer composed of perylene and also an electronic structure in accordance with various embodiments including a metal growth layer composed of germanium having a layer thickness of 0.5 nm and an electronic structure including a metal growth layer composed of germanium in accordance with various embodiments having a layer thickness of 3 nm are presented in the following table.

| | 0 + 11 nm Ag | 0 + 0.5 nm Ge + 11 nm Ag | 0 + 3 nm Ge + 11 nm Ag | 0 + 3 nm perylene + 11 nm Ag |
|---|---|---|---|---|
| Transmission measured at λ 550 nm | 51% | 53% | 53% | 46% |
| Sheet resistance in [ohms/squ] | 5.9 | 5.1 | 5.0 | 15.0 |

Figure 6:
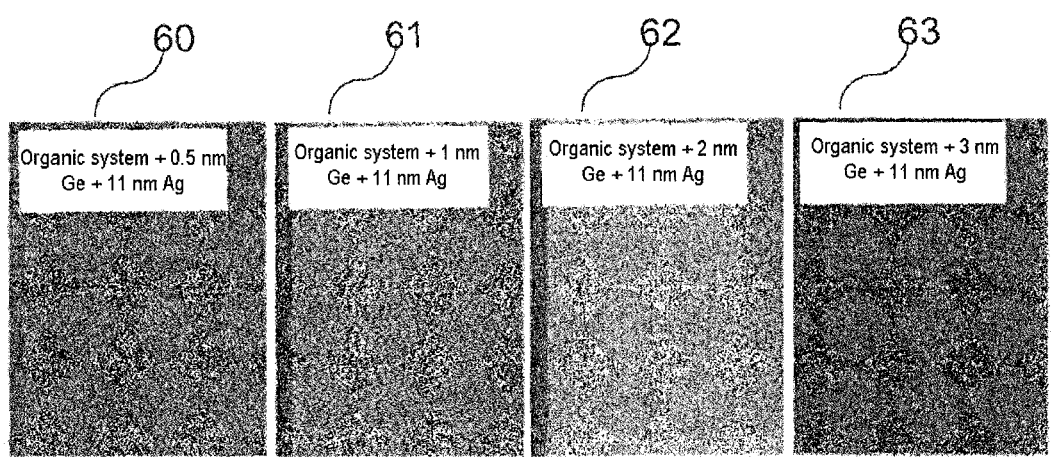
FIG. 6 shows SEM micrographs of Ag cathode films of electronic structures including germanium (Ge) as metal growth layer on an n-doped oganic support in accordance with various embodiments.

FIG. 6 shows SEM micrographs (first SEM micrograph 60, second SEM micrograph 61, third SEM micrograph 62, and fourth SEM micrograph 63) of Ag cathode films of electronic structures including germanium (Ge) as a metal growth layer on an n-doped organic layer (or else support) in accordance with various embodiments.

By way of example, in this case, the previously chosen layer thickness of the wetting promoter for germanium of 3 nm (fourth SEM micrograph 63) can be reduced to just 0.5 nm (first SEM micrograph 60), without defect structures forming in the Ag cathode film.

Figure 7:
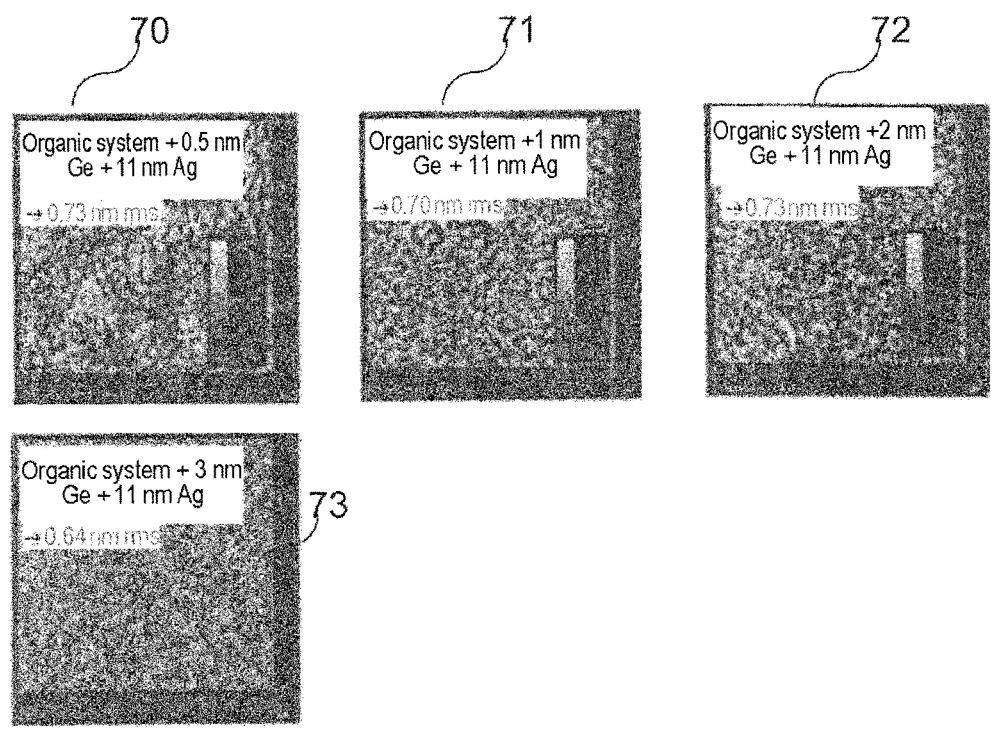
FIG. 7 shows AFM micrographs of Ag cathode films of electronic structures including germanium (Ge) as metal growth layer on an n-doped oganic support in accordance with various embodiments.

Homogeneous and closed growth of the Ag cathode film is also confirmed via AFM micrographs in FIG. 7. In this respect, FIG. 7 shows AFM micrographs of Ag cathode films of electronic structures including germanium (Ge) as a metal growth layer on an n-doped organic support in accordance with various embodiments. Embodiments shown in FIG. 7 include germanium as metal growth layers having a layer thickness of 0.5 nm (first AFM micrograph 70), 1 nm (second AFM micrograph 71), 2 nm (third AFM micrograph 72) and 3 nm (fourth AFM micrograph 73). The electronic structures include an n-doped organic substrate, to which the respective metal growth layer is applied. The Ag cathode film has a layer thickness of 11 nm and is grown onto the metal growth layer. The roughness value of the surfaces of the Ag cathode films can be discerned in the AFM micrographs. Said roughness value does not correlate with the Ge layer thickness (0.5 nm, 1 nm, 2 nm, 3 nm) and has just a value of 0.6-0.7 nm RMS for all layer thicknesses of the metal growth layers. The transparency at a wavelength of λ=550 nm is approximately 53% and the sheet resistance of the Ag cathode films is 5.0 ohm/squ. It can be observed that transparency and sheet resistance in the region examined are scarcely influenced by the germanium layer thickness in the range of between 0.5 nm and 3 nm. FIG. 9 illustrates corresponding transmission and absorption measurements in comparison with other embodiments, also with conventional embodiments.

Figure 8:
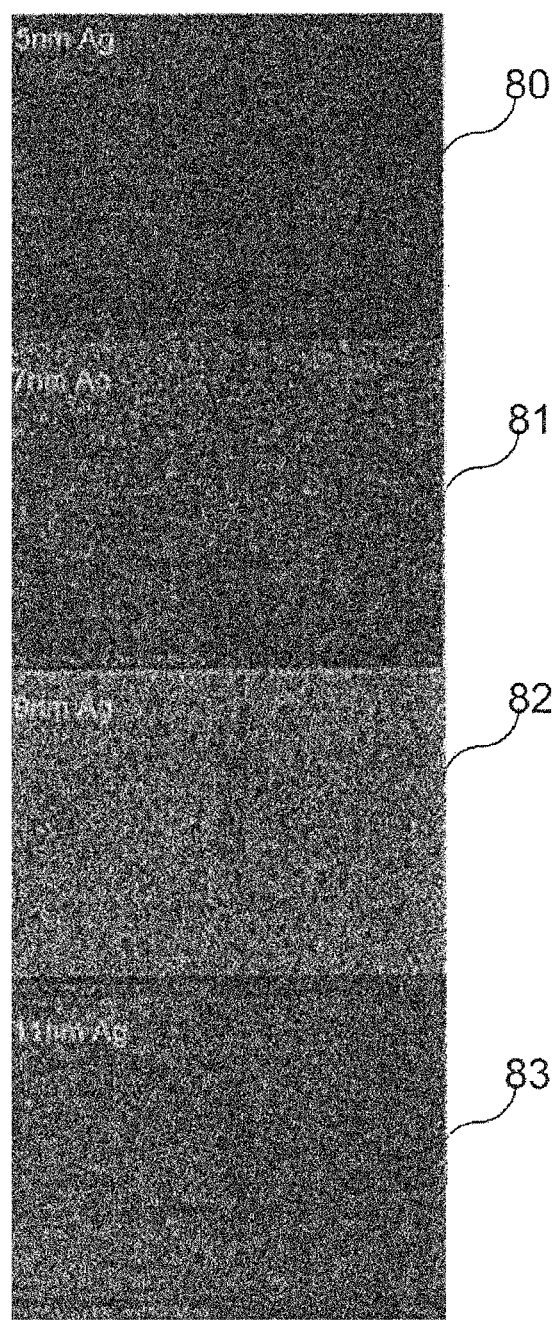
FIG. 8 shows SEM micrographs of Ag cathode films of electronic structures including germanium (Ge) as metal growth layer in accordance with various embodiments.

FIG. 8 shows SEM micrographs of Ag cathode films of electronic structures including germanium (Ge) as a metal growth layer in accordance with various embodiments. The metal growth layer has a layer thickness of 1 nm, and the Ag cathode films grown onto the metal growth layer have the layer thicknesses 5 nm (first SEM micrograph 80), 7 nm (second SEM micrograph 81), 9 nm (third SEM micrograph 82), 11 nm (fourth SEM micrograph 83). The SEM micrographs show that the imaged Ag cathode films are already percolated in the range of the layer thickness of the Ag cathode film of between 5 nm and 7 nm and the Ag cathode film having the layer thickness of 11 nm is completely closed.

FIG. 9 shows diagrams 90, 91 illustrating the transmission and absorption of light by light-emitting reference components as a function of the wavelength of the emitted light in accordance with various embodiments in comparison with conventional embodiments, 90 nm organic layer, 11 nm silver layer and 90 nm organic layer, 3 nm perylene layer, 11 nm silver layer. The characteristic curves of the light-emitting reference components in accordance with various embodiments, 90 nm organic layer 112, 0.5 nm metal growth layer 114 composed of germanium, 11 nm metal layer 116 composed of silver, and 90 nm organic layer 112, 0.5 nm metal growth layer 114 composed of germanium, 11 nm metal layer 116 composed of silver, exhibit, in the range of approximately $\lambda=500$ nm and $\lambda=800$ nm, a significantly higher transmission and a significantly lower absorption than conventional reference components. The characteristic curve of the metal growth layer 114 having the layer thickness of 0.5 nm composed of germanium exhibits particularly good values. The characteristic curve of the reference component including a 3 nm perylene layer exhibits the lowest values of transmission and the highest absorption values in the range of approximately $\lambda=500$ nm and $\lambda=800$ nm.

Figure 10:
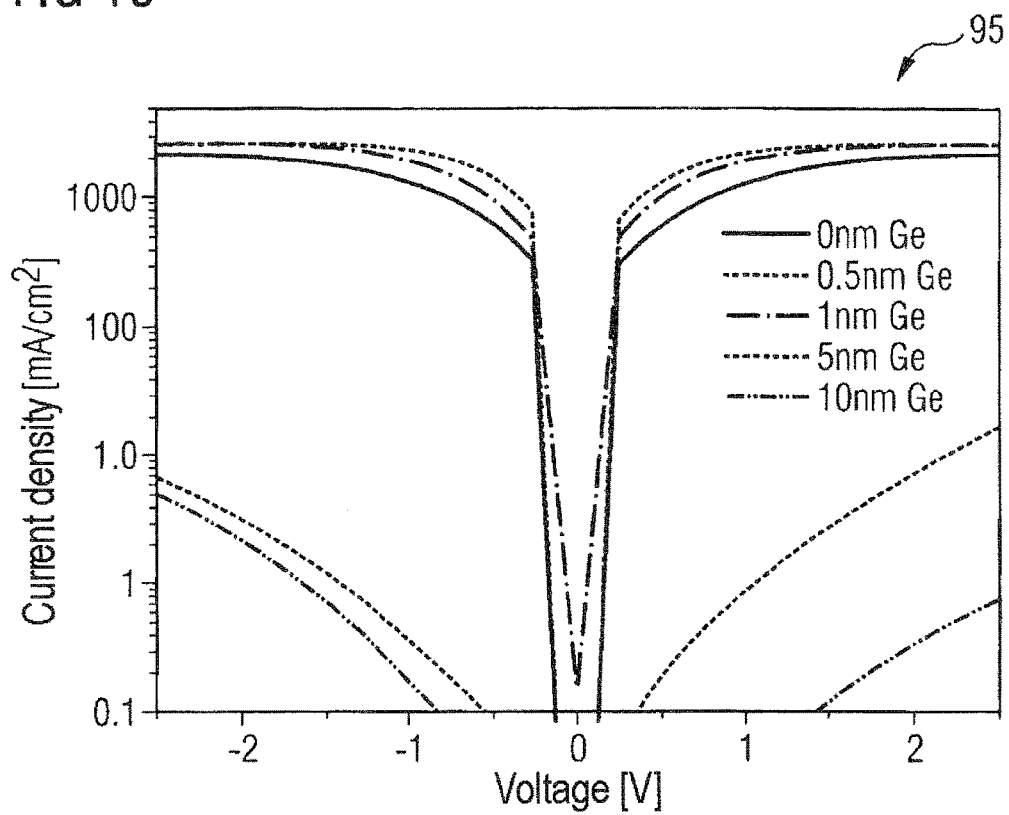
FIG. 10 shows a diagram of the current-voltage characteristic of Ag cathode films of electronic structures including germanium (Ge) as metal growth layer in accordance with various embodiments.

FIG. 10 shows a diagram 95 of the current-voltage characteristic of Ag cathode films of electronic structures including germanium (Ge) as a metal growth layer in accordance with various embodiments.

The current-voltage characteristic is illustrated for electronic structures, wherein the substrate or the organic electron injection/transport layer is ITO having a layer thickness of 90 nm. The layer thicknesses of the metal growth layers composed of germanium are 0.5 nm and 3 nm. The Ag cathode films have a layer thickness of 11 nm. The current-voltage characteristics of two conventional electronic structures are plotted for comparison. One conventional electronic structure has no metal growth layer, and the second conventional electronic structure has, as a wetting promoter, a perylene interlayer having a layer thickness of 3 nm between the substrate and the Ag cathode film. The current-voltage characteristic shows that the charge carrier injection of such a stack construction of an electronic structure can be significantly improved by the thin metal growth layer composed of germanium by comparison with the conventional electronic structures. The significant improvement in the charge injection is achieved by the Ag surface—which is homogeneous and closed by means of the metal growth layer composed of germanium—of the grown Ag cathode film and a resultant higher and more uniform local current density.

Without the metal growth layer, inhomogeneous trench or island structures can illustratively increase the sheet resistance and, on account of an additional series resistance, can thus lead to a reduced current density at a predefined voltage in comparison with a component including the growth layer. However, if the layer thickness of the metal growth layer composed of germanium increases (shown here for 5 nm and 10 nm germanium), the current density can decrease again. This opposite behavior can be attributed, for example, on the one hand, to an increase in the series resistance of the metal growth layer composed of germanium with increasing layer thickness and, on the other hand, as a result of a different injection behavior of the charge carriers through the growth layer. In the case of a very thin growth layer, the injection can take place for example as a result of the so-called tunnel effect from the silver into the adjoining organic layer, whereas the probability of tunneling decreases as the layer thickness increases. The optimum component configuration results from the optimization of the growth behavior of the succeeding layer for minimizing the sheet resistance and the optimum injection into the adjoining organic layer.

Figure 11:
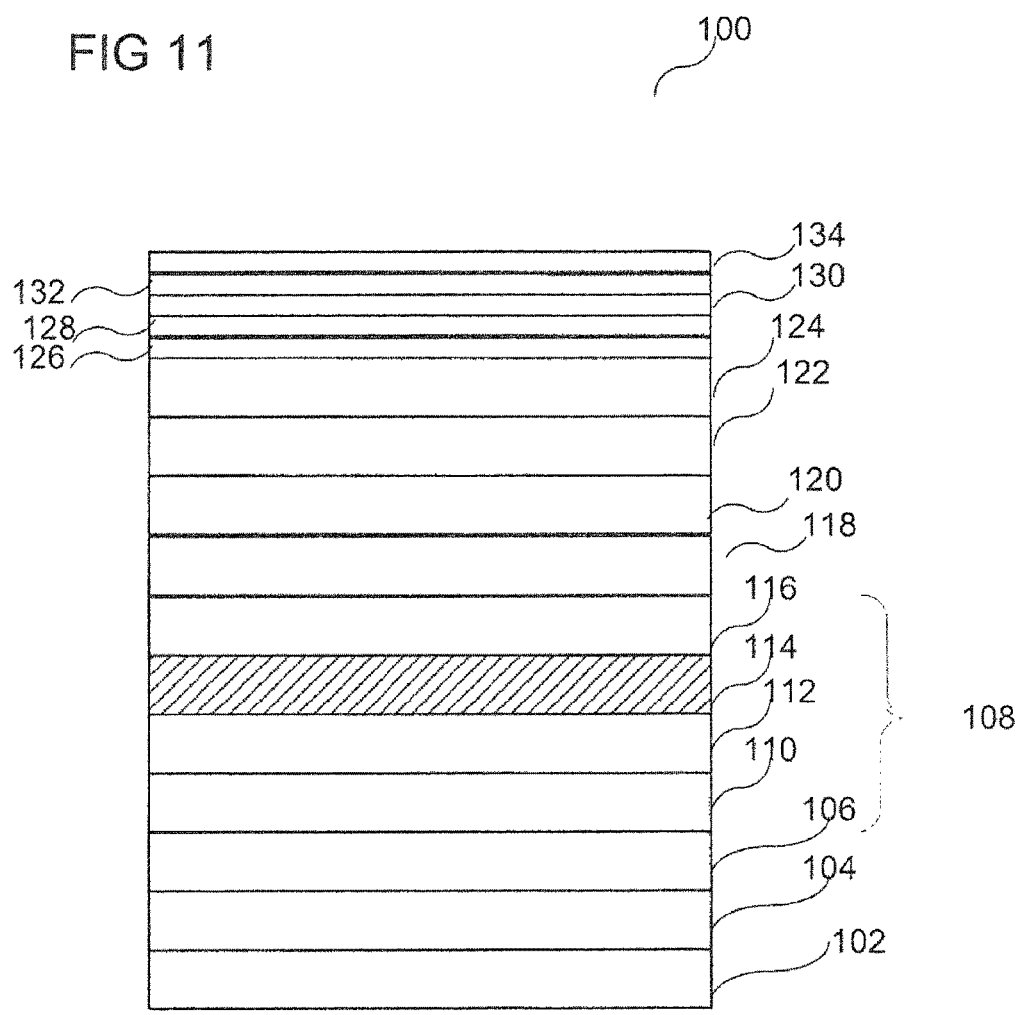
FIG. 11 shows a cross-sectional view of an electronic structure in accordance with various embodiments.

FIG. 11 shows a cross-sectional view of an electronic structure 100 in accordance with various embodiments. The electronic structure 100 can be for example a transparent electrode or conductor track, for example for organic photovoltaic applications such as organic solar modules, for example. The electronic structure 100 can be a transparent integrated circuit, for example.

The electronic structure 100 can also be embodied as a transparent TFT display or else as a transparent memory chip, also called "See Through Electronic Memory".

The electronic structure 100 can also be embodied as a so-called top emitting organic light-emitting diode (OLED)—or else organic light-emitting diode (OLED) that emits on the cover glass side. The electronic structure 100 can for example also be embodied as a (transparent) OLED that emits on both sides. The OLED can also be drivable in this case.

A further embodiment of an electronic structure 100 can also be a stacked OLED including a so-called charge generation layer (CGL).

The electronic structure 100 can be embodied for example as a light-emitting component 100 in the form of an organic light-emitting diode (OLED) 100 for the illustration of various embodiments in FIG. 11.

The electronic structure 100, hereafter organic light-emitting diode 100, can have a substrate 102. The substrate 102 can serve for example as a carrier element for electronic elements or layers, for example light-emitting elements. By way of example, the substrate 102 can include or be formed from glass, quartz, and/or a semiconductor material or any other suitable material. Furthermore, the substrate 102 can include or be formed from a plastic film or a laminate including one or including a plurality of plastic films. The plastic can include or be formed from one or more polyolefins (for example high or low density polyethylene (PE) or polypropylene (PP)). Furthermore, the plastic can include or be formed from polyvinyl chloride (PVC), polystyrene (PS), polyester and/or polycarbonate (PC), polyethylene terephthalate (PET), polyether sulfone (PES) and/or polyethylene naphthalate (PEN). The substrate 102 can include one or more of the materials mentioned above. The substrate 102 can be embodied as translucent or even transparent.

In various embodiments, the term "translucent" or "translucent layer" can be understood to mean that a layer is transmissive to light, for example to the light generated by the organic light-emitting diode, for example in one or more wavelength ranges, for example to light in a wavelength range of visible light (for example at least in a partial range of the wavelength range of from 380 nm to 780 nm). By way of example, in various embodiments, the term "translucent layer" should be understood to mean that substantially the entire quantity of light coupled into a structure (for example a layer) is also coupled out from the structure (for example layer), wherein part of the light can be scattered in this case.

In various embodiments, the term "transparent" or "transparent layer" can be understood to mean that a layer is transmissive to light (for example at least in a partial range of the wavelength range of from 380 nm to 780 nm), wherein light coupled into a structure (for example a layer) is also coupled out from the structure (for example layer) substantially without scattering or light conversion. Consequently, in various embodiments, "transparent" should be regarded as a special case of "translucent".

For the case where, for example, a light-emitting monochromatic or emission spectrum-limited electronic structure 100, for example the organic light-emitting diode 100, is intended to be provided, it suffices for the optically translucent layer structure to be translucent at least in a partial range of the wavelength range of the desired monochromatic light or for the limited emission spectrum.

In various embodiments, the organic light-emitting diode 100 (or else the light-emitting components in accordance with the embodiments that have been described above or will be described below or generally the electronic structure) can be designed as a so-called top and bottom emitter. A top and bottom emitter can also be designated as an optically transparent component, for example a transparent organic light-emitting diode.

In various embodiments, a barrier layer 104 can optionally be arranged on or above the substrate 102. The barrier layer 104 can include or consist of one or more of the following materials: aluminum oxide, zinc oxide, zirconium oxide, titanium oxide, hafnium oxide, tantalum oxide lanthanum oxide, silicon oxide, silicon nitride, silicon oxynitride, indium tin oxide, indium zinc oxide, aluminum-doped zinc oxide, and mixtures and alloys thereof. Furthermore, in various embodiments, the barrier layer 104 can have a layer thickness in a range of approximately 0.1 nm (one atomic layer) to approximately 5000 nm, for example a layer thickness in a range of approximately 10 nm to approximately 200 nm, for example a layer thickness of approximately 40 nm.

A planarization layer 106 can optionally be arranged on or above the optional barrier layer 104 or else on the substrate 102. The planarization layer 106 can also be embodied in a multilayered fashion for example depending on the respective substrate 102.

An electrically active region 108 of the organic light-emitting diode 100 can be arranged on or above the optional barrier layer 104 or else on the substrate 102 or the planarization layer 106. The electrically active region 108 can be understood as that region of the light-emitting component 100 in which an electric current for the operation of the organic light-emitting diode 100 flows. In various embodiments, the electrically active region 106 can have a first electrode 110, an organic layer 112 and a metal growth layer 114 grown onto said organic layer 112 or else organic functional layer structure 112, and at least one metal layer 116 grown on the metal growth layer 114, wherein the at least one metal growth layer 114 contains germanium, as will be explained in even greater detail below. In this case, the metal layer 116 can be a second electrode 116, for example.

In this regard, in various embodiments, the first electrode 110 (for example in the form of a first electrode layer 110) can be applied on or above the barrier layer 104 (or, if the barrier layer 104 is not present, on or above the substrate 102). The first electrode 110 (also designated hereinafter as bottom electrode 110) can be formed from an electrically conductive material, such as, for example, from a metal or a transparent conductive oxide (TCO) or a layer stack including a plurality of layers of the same metal or different metals and/or the same TCO or different TCOs. Transparent conductive oxides are transparent conductive materials, for example metal oxides, such as, for example, zinc oxide, tin oxide, cadmium oxide, titanium oxide, indium oxide, or indium tin oxide (ITO). Alongside binary metal-oxygen compounds, such as, for example, $ZnO$, $SnO_2$, or $In_2O_3$, ternary metal-oxygen compounds, such as, for example, $AlZnO$, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped.

In various embodiments, the first electrode 110 can include a metal; for example Ag, Pt, Au, Mg, Al, Ba, In, Ag, Au, Mg, Ca, Sm or Li, and compounds, combinations or alloys of these materials.

In various embodiments, the first electrode 110 can be formed by a layer stack of a combination of a layer of a metal on a layer of a TCO, or vice versa. One example is a silver layer applied on an indium tin oxide layer (ITO) (Ag on ITO) or ITO-Ag-ITO multilayers. In this case, a further metal growth layer 114 containing germanium or consisting of germanium can be applied to the first ITO layer as a wetting promoter in order to improve the homogeneous deposition for example of Ag as a layer of the layer stack of the first electrode 110 in the layer sequence.

In various embodiments, the first electrode 110 can provide one or a plurality of the following materials as an alternative or in addition to the abovementioned materials: networks composed of metallic nanowires and nanoparticles, for example composed of Ag; networks composed of carbon nanotubes; graphene particles and graphene layers; networks composed of semiconducting nanowires.

Furthermore, the first electrode 110 can include electrically conductive polymers or transition metal oxides or transparent electrically conductive oxides.

In various embodiments, the first electrode 110 and the substrate 102 can be formed as translucent or transparent. In the case where the first electrode 110 is formed from a metal, the first electrode 110 can have for example a layer thickness of less than or equal to approximately 25 nm, for example a layer thickness of less than or equal to approximately 20 nm, for example a layer thickness of less than or equal to approximately 18 nm. Furthermore, the first electrode 108 can have for example a layer thickness of greater than or equal to approximately 7 nm, for example a layer thickness of greater than or equal to approximately 15 nm. In various embodiments, the first electrode 108 can have a layer thickness in a range of approximately 7 nm to approximately 25 nm, for example a layer thickness in a range of approximately 10 nm to approximately 18 nm, for example a layer thickness in a range of approximately 14 nm to approximately 18 nm.

Furthermore, for the case where the first electrode 110 is formed from a transparent conductive oxide (TCO), the first electrode 110 can have for example a layer thickness in a range of approximately 50 nm to approximately 500 nm, for example a layer thickness in a range of approximately 75 nm to approximately 250 nm, for example a layer thickness in a range of approximately 100 nm to approximately 150 nm.

Furthermore, for the case where the first electrode 110 is formed from, for example, a network composed of metallic nanowires, for example composed of Ag, which can be combined with conductive polymers, a network composed of carbon nanotubes which can be combined with conductive polymers, or from graphene layers and composites, the first electrode 108 can have for example a layer thickness in a range of approximately 1 nm to approximately 500 nm, for example a layer thickness in a range of approximately 10 nm to approximately 400 nm, for example a layer thickness in a range of approximately 40 nm to approximately 250 nm.

The first electrode 110 can be formed as an anode, that is to say as a hole-injecting electrode, or as a cathode, that is to say as an electron-injecting electrode.

The first electrode 110 can have a first electrical terminal, to which a first electrical potential (provided by an energy store (not illustrated), for example a current source or a voltage source) can be applied. Alternatively, the first electrical potential can be applied to the substrate 102 and then be fed indirectly to the first electrode 110 via said substrate. The first electrical potential can be, for example, the ground potential or some other predefined reference potential.

Furthermore, the electrically active region 108 of the organic light-emitting diode 100 can have an organic electroluminescent layer structure 114, which is applied on or above the first electrode 110.

The organic electroluminescent layer structure 114 can contain one or a plurality of emitter layers 118, for example including fluorescent and/or phosphorescent emitters, and one or a plurality of hole-conducting layers 120 (also designated as hole transport layer(s) 120). In various embodiments, one or a plurality of electron-conducting layers 122 (also designated as electron transport layer(s) 122) can alternatively or additionally be provided.

Examples of emitter materials which can be used in the light-emitting component 100 in accordance with various embodiments for the emitter layer(s) 118 include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl-(2-carboxypyridyl)-iridium III), green phosphorescent Ir(ppy)$_3$(tris(2-phenylpyridine)iridium III), red phosphorescent Ru(dtb-bpy)$_3$*2(PF$_6$) (tris[4,4'-di-tert-butyl-(2,2')-bipyridine]ruthenium(III) complex) and blue fluorescent DPAVBi (4,4-bis[4-(di-p-tolylamino)styryl]biphenyl), green fluorescent TTPA (9,10-bis[N,N-di-(p-tolyl)-amino]anthracene) and red fluorescent DCM2 (4-dicyanomethylene)-2-methyl-6-julolidyl-9-enyl-4H-pyran) as non-polymeric emitters. Such non-polymeric emitters can be deposited by means of thermal evaporation, for example. Furthermore, it is possible to use polymer emitters, which can be deposited, in particular, by means of a wet-chemical method such as spin coating, for example.

The emitter materials can be embedded in a matrix material in a suitable manner.

It should be pointed out that other suitable emitter materials are likewise provided in other embodiments.

The emitter materials of the emitter layer(s) 118 of the organic light-emitting diode 100 can be selected for example such that the organic light-emitting diode 100 emits white light. The emitter layer(s) 118 can include a plurality of emitter materials that emit in different colors (for example blue and yellow or blue, green and red); alternatively, the emitter layer(s) 118 can also be constructed from a plurality of partial layers, such as a blue fluorescent emitter layer 118 or blue phosphorescent emitter layer 118, a green phosphorescent emitter layer 118 and a red phosphorescent emitter layer 118. By mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary radiation and secondary radiation.

The organic electroluminescent layer structure 110 can generally include one or a plurality of electroluminescent layers. The one or the plurality of electroluminescent layers can include organic polymers, organic oligomers, organic monomers, organic small, non-polymeric molecules ("small molecules") or a combination of these materials. By way of example, the organic electroluminescent layer structure 110 can include one or a plurality of electroluminescent layers embodied as a hole transport layer 120, so as to enable for example in the case of an OLED an effective hole injection into an electroluminescent layer or an electroluminescent region. Alternatively, in various embodiments, the organic electroluminescent layer structure 110 can include one or a plurality of functional layers embodied as an electron transport layer 122, so as to enable for example in an OLED 100 an effective electron injection into an electroluminescent layer or an electroluminescent region. By way of example, tertiary amines, carbazo derivatives, conductive polyaniline or polyethylene dioxythiophene can be used as material for the hole transport layer 120. In various embodiments, the one or the plurality of electroluminescent layers can be embodied as an electroluminescent layer.

In various embodiments, the hole transport layer 120 can be applied, for example deposited, on or above the first electrode 110, and the emitter layer 118 can be applied, for example deposited, on or above the hole transport layer 120. In various embodiments, the electron transport layer 122 can be applied, for example deposited, on or above the emitter layer 118.

In various embodiments, the organic electroluminescent layer structure 110 (that is to say for example the sum of the thicknesses of hole transport layer(s) 120 and emitter layer(s) 118 and electron transport layer(s) 122) can have a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic electroluminescent layer structure 110 can have for example a stack of a plurality of organic light-emitting diodes (OLEDs) arranged directly one above another, wherein each OLED can have for example a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic electroluminescent layer structure 110 can have for example a stack of two, three or four OLEDs arranged directly one above another, in which case for example the organic electroluminescent layer structure 110 can have a layer thickness of a maximum of approximately 3 µm.

The organic light-emitting diode 100 can optionally generally include further organic functional layers, for example arranged on or above the one or the plurality of emitter layers 118 or on or above the electron transport layer(s) 122, which serve to further improve the functionality and thus the efficiency of the organic light-emitting diode 100.

On or above the organic electroluminescent layer structure 110 or, if appropriate, on or above the one or the plurality of further organic functional layers.

In various embodiments, the metal growth layer 114 containing germanium can be a metallic multi-substance system. The metallic multi-substance system can be an alloy, for example. Alloys can be, for example, alloys of the system germanium-silver. Alloys of the germanium-silver system can contain compositions having a substance amount proportion of silver in a range of approximately 0.1% and approximately 99.999%. The alloy can have a substance amount proportion of 0.1% silver. Alloys can be alloys of the system germanium-gold. Alloys of the germanium-gold system can have compositions having a substance amount proportion of gold in a range of approximately 0.1% and approximately 99.999%. The alloy may contain a substance amount proportion of 0.1% gold. Alloys can be, for example, alloys of the system germanium-copper. Alloys of the germanium-copper system can have compositions having a substance amount proportion of copper in a range of approximately 0.1% and approximately 99.999%. The alloy can contain a substance amount proportion of 0.1% copper.

In one configuration, the metal growth layer 114 can be a pure germanium growth layer 114 (in other words, the metal growth layer 114 can consist of 100% pure germanium). In this configuration, the germanium growth layer 114 can have a layer thickness in a range of approximately 0.1 nm to approximately 10 nm, for example a layer thickness in a range of approximately 0.1 nm to approximately 3 nm, for example a layer thickness in a range of approximately 0.1 nm to approximately 1 nm.

In various embodiments, the metal growth layer 114 can contain germanium oxide or consist of germanium oxide ($GeO_2$).

The metal growth layer 114 can be embodied as a monolayer. The metal growth layer can have for example a layer thickness in a range of approximately 0.1 nm and approximately 10 nm.

In various embodiments, the layer thicknesses of metal growth layers 114 can have for example a layer thickness of approximately 0.1 nm, for example a layer thickness of approximately 0.5 nm, for example a layer thickness of approximately 3 nm.

The layer thickness of the metal growth layer 114 can have for example a layer thickness of approximately 10 nm.

The second electrode 116 (for example in the form of a second electrode layer 116) can be grown or else applied onto the metal growth layer 114.

In various embodiments, the second electrode 116 can include or be formed from the same materials as the first electrode 110, metals being particularly suitable in various embodiments.

In various embodiments, the second electrode 116 (for example for the case of a metallic second electrode 112) can have for example a layer thickness of less than or equal to approximately 25 nm, for example a layer thickness of less than or equal to approximately 15 nm, for example 11 nm, for example a layer thickness of less than or equal to approximately 10 nm.

The second electrode 116 can generally be embodied in a similar manner to the first electrode 110, or differently than the latter. In various embodiments, the second electrode 116 can be embodied from one or more of the materials and with the respective layer thickness, as described above in connection with the first electrode 110. In various embodiments, the first electrode 110 and the second electrode 116 are both embodied as translucent or transparent. Consequently, the light-emitting component 100 illustrated in FIG. 1 can be designed as a top and bottom emitter (to put it another way as a transparent light-emitting structure 100).

The metal layer 116, for example the second electrode 116, can be embodied as an anode, that is to say as a hole-injecting electrode, or as a cathode, that is to say as an electron-injecting electrode.

The metal layer 116 can contain silver (Ag). In various embodiments, the metal layer 116 can be embodied as a silver cathode 116, in other words as a silver cathode film 116 (or else Ag cathode film 116).

The silver cathode 116 or the Ag cathode film 116 can be embodied for example as a transparent Ag cathode film 116.

In various embodiments, the metal layer 116 can be embodied as a layer structure having at least one further metal growth layer 114 containing germanium. The further metal growth layer 114, as a further wetting promoting layer, can optimize the growth of a further metal layer 116. In various embodiments, the metal layer 116 can have for example a layer construction having the layer sequence Ge/Ag/Ge, or for example Ge/Ag/Ge/Ag.

In various embodiments, the metal layer 116 of the organic light-emitting diode 100 can be embodied for example as a transparent top contact.

The metal layer 116 can be embodied for example as a layer structure having a metal growth layer 114 containing germanium, and a further metal layer 116 grown onto the metal growth layer 114, said further metal layer containing silver. A lower viewing angle dependence can additionally be achieved as a result.

In various embodiments, the metal layer 116 of the organic light-emitting diode 100 can be embodied for example as a transparent center contact. The metal layer 116 can be embodied for example as a layer structure having a metal growth layer 114 containing germanium, and a further metal layer 116 grown onto the metal growth layer 114, said further metal layer containing silver.

In various embodiments, the organic light-emitting diode 100, for example as an organic light-emitting diode 100 that emits on both sides, can have a first metal layer 116, embodied as a transparent top contact, and can have a further metal layer 116, embodied as a transparent center contact.

The second electrode 116, or metal layer 116, can have a second electrical terminal, to which a second electrical potential (which is different than the first electrical potential), provided by the energy source, can be applied. The second electrical potential can have for example a value such that the difference with respect to the first electrical potential has a value in a range of approximately 1.5 V to approximately 20 V, for example a value in a range of approximately 2.0 V to approximately 15 V, for example a value in a range of approximately 2.5 V to approximately 12 V.

In various embodiments, the organic light-emitting diode 100 can be designed for example as a top emitting organic light-emitting diode 100, or else organic light-emitting diode 100 that emits on the cover glass side, for example as an organic light-emitting diode 100 that emits on both sides, for example as a bottom emitting organic light-emitting diode 100.

The top emitting organic light-emitting diode 100 can have a first electrode 110, for example, which has a layer thickness in the range of a semitransparent or nontransparent layer.

In various embodiments, the organic diode 100 can optionally have an antireflection coating 124, for example embodied as a dielectric layer serving for antireflection purposes. The antireflective coating 124 can for example also be embodied in a multilayered fashion.

An encapsulation 126, for example in the form of a barrier thin-film layer/thin-film layer encapsulation 126, can optionally also be formed on or above the metal layer 116, or second electrode 116, and thus on or above the electrically active region 108.

In the context of this application, a "barrier thin-film layer" or a "barrier thin film" 126 can be understood to mean, for example, a layer or a layer structure which is suitable for forming a barrier against chemical impurities or atmospheric substances, in particular against water (moisture) and oxygen. In other words, the barrier thin-film layer 126 is formed in such a way that OLED-damaging substances such as water, oxygen or solvent cannot penetrate through it or at most very small proportions of said substances can penetrate through it.

In accordance with one configuration, the barrier thin-film layer 126 can be formed as an individual layer (to put it another way, as a single layer). In accordance with an alternative configuration, the barrier thin-film layer 126 can include a plurality of partial layers formed one on top of another. In other words, in accordance with one configuration, the barrier thin-film layer 126 can be formed as a layer stack. The barrier thin-film layer 126 or one or a plurality of partial layers of the barrier thin-film layer 126 can be formed for example by means of a suitable deposition method, e.g. by means of an atomic layer deposition (ALD) method in accordance with one configuration, e.g. a plasma enhanced atomic layer deposition (PLALD) method or a plasmaless atomic layer deposition (PLALD) method, or by means of a chemical vapor deposition (CVD) method in accordance with another configuration, e.g. a plasma enhanced chemical vapor deposition (PECVD) method or a plasmaless chemical vapor deposition (PLCVD) method, or alternatively by means of other suitable deposition methods.

By using an atomic layer deposition (ALD) method, it is possible for very thin layers to be deposited. In particular, layers having layer thicknesses in the atomic layer range can be deposited.

In accordance with one configuration, in the case of a barrier thin-film layer 126 having a plurality of partial layers, all the partial layers can be formed by means of an atomic layer deposition method. A layer sequence including only ALD layers can also be designated as a "nanolaminate".

In accordance with an alternative configuration, in the case of a barrier thin-film layer 126 including a plurality of partial layers, one or a plurality of partial layers of the barrier thin-film layer 120 can be deposited by means of a different deposition method than an atomic layer deposition method, for example by means of a vapor deposition method.

In accordance with one configuration, the barrier thin-film layer 126 can have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

In accordance with one configuration in which the barrier thin-film layer 126 includes a plurality of partial layers, all the partial layers can have the same layer thickness. In accordance with another configuration, the individual partial layers of the barrier thin-film layer 126 can have different layer thicknesses. In other words, at least one of the partial layers can have a different layer thickness than one or more other partial layers.

In accordance with one configuration, the barrier thin-film layer 126 or the individual partial layers of the barrier thin-film layer 126 can be formed as a translucent or transparent layer. In other words, the barrier thin-film layer 126 (or the individual partial layers of the barrier thin-film layer 126) can consist of a translucent or transparent material (or a material combination that is translucent or transparent).

In accordance with one configuration, the barrier thin-film layer 126 or (in the case of a layer stack having a plurality of partial layers) one or a plurality of the partial layers of the barrier thin-film layer 126 can include or consist of one of the following materials: aluminum oxide, zinc oxide, zirconium oxide, titanium oxide, hafnium oxide, tantalum oxide lanthanum oxide, silicon oxide, silicon nitride, silicon oxynitride, indium tin oxide, indium zinc oxide, aluminum-doped zinc oxide, and mixtures and alloys thereof. In various embodiments, the barrier thin-film layer 126 or (in the case of a layer stack having a plurality of partial layers) one or a plurality of the partial layers of the barrier thin-film layer 126 can include one or a plurality of high refractive index materials, to put it another way one or a plurality of materials having a high refractive index, for example having a refractive index of at least 1.8.

In various embodiments, a low refractive index intermediate layer or low refractive index intermediate layer structure 128 (for example having one or a plurality of layers composed of the same material or different materials) can be arranged on or above the encapsulation 126 and serves, in the case of an electronic structure 100, to increase the total transparency thereof.

The intermediate layer or intermediate layer structure 128 can include at least one layer which (at a predefined wavelength (for example at a predefined wavelength in a wavelength range of 380 nm to 780 nm)) has a refractive index which is less than the refractive index of a cover (at the predefined wavelength) of the light-emitting component 100. In various embodiments, the intermediate layer or the at least one layer of the intermediate layer structure or the entire intermediate layer structure 128 can have a refractive index which is less than the refractive index of a cover of the organic light-emitting diode 100.

In various embodiments, a planarization or buffer layer 130 can optionally be arranged on or above the encapsulation 126 or above the low refractive index intermediate layer 128. The planarization or buffer layer 130 can be embodied in a multilayered fashion, for example.

In various embodiments, an optional anti-scratch protective layer 132 can be arranged on or above the encapsulation 126 or on or above the low refractive index optional intermediate layer 128 or on or above the optional planarization or buffer layer 130. The anti-scratch protective layer 132 can be for example a cover glass, can be for example a cover film, can be for example a lacquer.

A scattering film 134 can optionally be arranged on the anti-scratch protective layer 132. The scattering film 134 can be for example a refractively scattering material, for example for a "translucent" OLED 100 that emits on both sides.

In various embodiments, the OLED 100 can be color-tunable. By way of example, the color-tunable OLED 100 can be a bottom emitter, a top emitter or a transparent OLED that emits on both sides. The transparent OLED can have for example a transparent center contact containing a metal growth layer 114 composed of germanium and a metal layer 116 composed of silver.

Top emitting OLEDs 100 can have a transparent top contact containing a metal growth layer 114 composed of germanium and a metal layer 116 composed of silver. A lower viewing angle dependence can additionally be achieved as a result. In addition, white-emitting top emitters can be made possible by the disclosure in a simple manner.

In various embodiments, the electronic structure 100, for example the organic light-emitting diode 100, can be embodied as flexible at least in regions.

In various embodiments, the organic light-emitting diode 100 can be embodied for example as a passive (non-luminous) display at least in regions.

In various embodiments, the electronic structure 100 can be designed as a conductor track. The conductor track can be embodied for example as transparent at least in regions.

In various embodiments, the electronic structure 100 can be designed as an electrode. The electrode can be embodied as transparent for example at least in regions.

In various embodiments in various embodiments, the electronic structure 100 can be designed as an intermediate electrode. The intermediate electrode can be embodied as transparent for example at least in regions.

In various embodiments, the electronic structure 100 can be designed for example as a transistor. The transistor can be embodied as transparent for example at least in regions.

In various embodiments, the electronic structure 100 can be designed for example as an electronic circuit. The electronic circuit can be embodied as transparent for example at least in regions.

In various embodiments, the electronic structure 100 can be designed for example as a solar cell. The organic layer 112 can be designed for example as a solar cell unit. The solar cell can be embodied for example as a semiconductor solar cell. The semiconductor solar cell can be for example a II-VI semiconductor solar cell. The semiconductor solar cell can be for example a III-V semiconductor solar cell. The semiconductor solar cell can be for example a I—III-VI semiconductor solar cell. In various embodiments, the solar cell can be embodied for example as an organic solar cell. In various embodiments, the solar cell can be embodied for example as a silicon solar cell.

In various embodiments, the electronic structure 100 can be embodied for example as a transparent Ge/Ag contact, thus as a contact formed from a metal growth layer 114 composed of germanium and a metal layer 116 composed of silver grown on the metal growth layer 114. The Ge/Ag contact is grown on an organic layer 112 at least in regions on the metal growth layer side. In various embodiments, by way of example, one contact or both contacts can be embodied as transparent Ge/Ag contacts. The transparent Ge/Ag contacts can serve for example as a transparent lead for a transparent OLED. It is also possible that only the Ge/Ag contacts, thus only the leads, are embodied as transparent, and the electrodes of the OLED themselves can be for example semitransparent or else nontransparent.

In various embodiments, an electronic component can be formed from at least one electronic structure 100. The component can be designed for example as a light-emitting component, for example as a display. The electronic component can have a PET film, for example. The electronic structure 100 can be arranged for example at least in regions on the PET film.

In the following figures, reference is made to the description in FIG. 11 and only additional or alternative features of the following figures, thus features that deviate from FIG. 11, will be described in order to avoid repetition.

Figure 12:
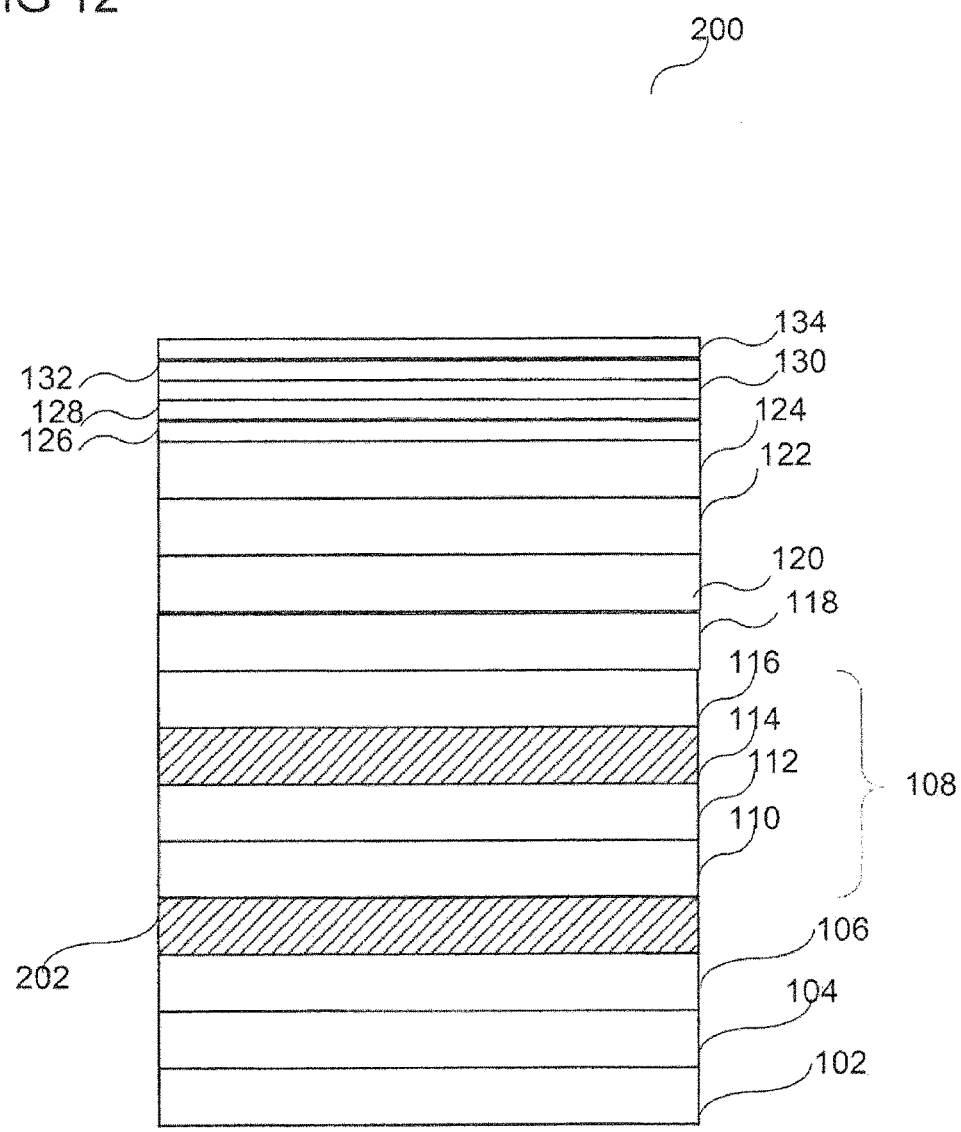
FIG. 12 shows a cross-sectional view of an electronic structure in accordance with various embodiments.

FIG. 12 shows a cross-sectional view of an electronic structure 200 in accordance with various embodiments. In various embodiments, the electronic structure 100 can include a further metal growth layer 202, which is grown onto the substrate 102 and which can be germanium, for example, can be germanium oxide, for example, can be a germanium alloy, for example, of the system germanium-silver, for example, of the system germanium-gold, for example, of the system germanium-copper, for example. The first electrode 110 is grown onto the metal growth layer 202. The first electrode 110 can be, as described in FIG. 11, for example a transparent ITO, IMI, ITO-Ag-ITO, so-called AZO electrode or silver, for example. The organic layer 112 has already been described in FIG. 11 and can be for example an electron or hole transport layer or for example an absorber layer, and grown onto it there follow, as described in FIG. 11, the metal growth layer 114, for example composed of germanium, and the metal layer 116 grown onto the latter, for example an Ag cathode film.

Figure 13:
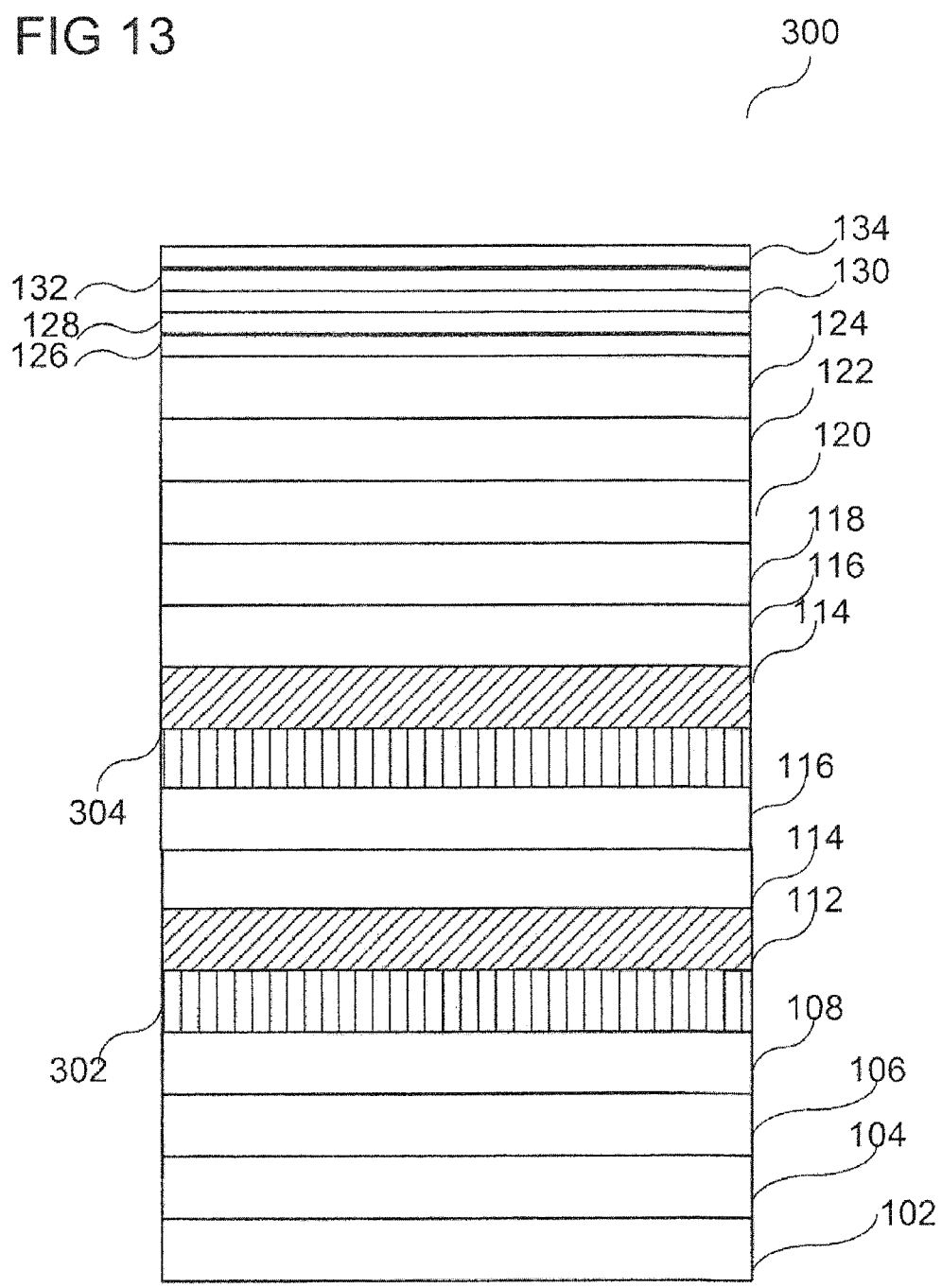
FIG. 13 shows a cross-sectional view of an electronic structure in accordance with various embodiments.

FIG. 13 shows a cross-sectional view of an electronic structure 300 in accordance with various embodiments. The electronic structure 300 can be a stacked structure, for example. The electronic structure 100 can include a first OLED unit 302, for example, which is formed from the organic layer or organic layer structure 112. In this case, the organic layer structure 112 can be formed for example from a plurality of layers and can have for example electron or hole transport layers, for example absorber layers, for example one or more charge generation layers (GCL), for vertically stacking OLEDs or solar cell units. The metal growth layer 114, as described above, can consist of germanium, for example, and the metal layer 116 can be for example a top contact, for example a transparent Ag cathode film. The metal layer 116 can be for example a multilayered cathode film, for example having a layer sequence Ag—Ge—Ag, and can thus include a further metal growth layer 114 and a further metal layer 116. A second OLED unit 304 can be arranged on the first OLED unit 302 and can be constructed in a manner corresponding to the first OLED unit 302. By way of example, further OLED units can be stacked.

Figure 14:
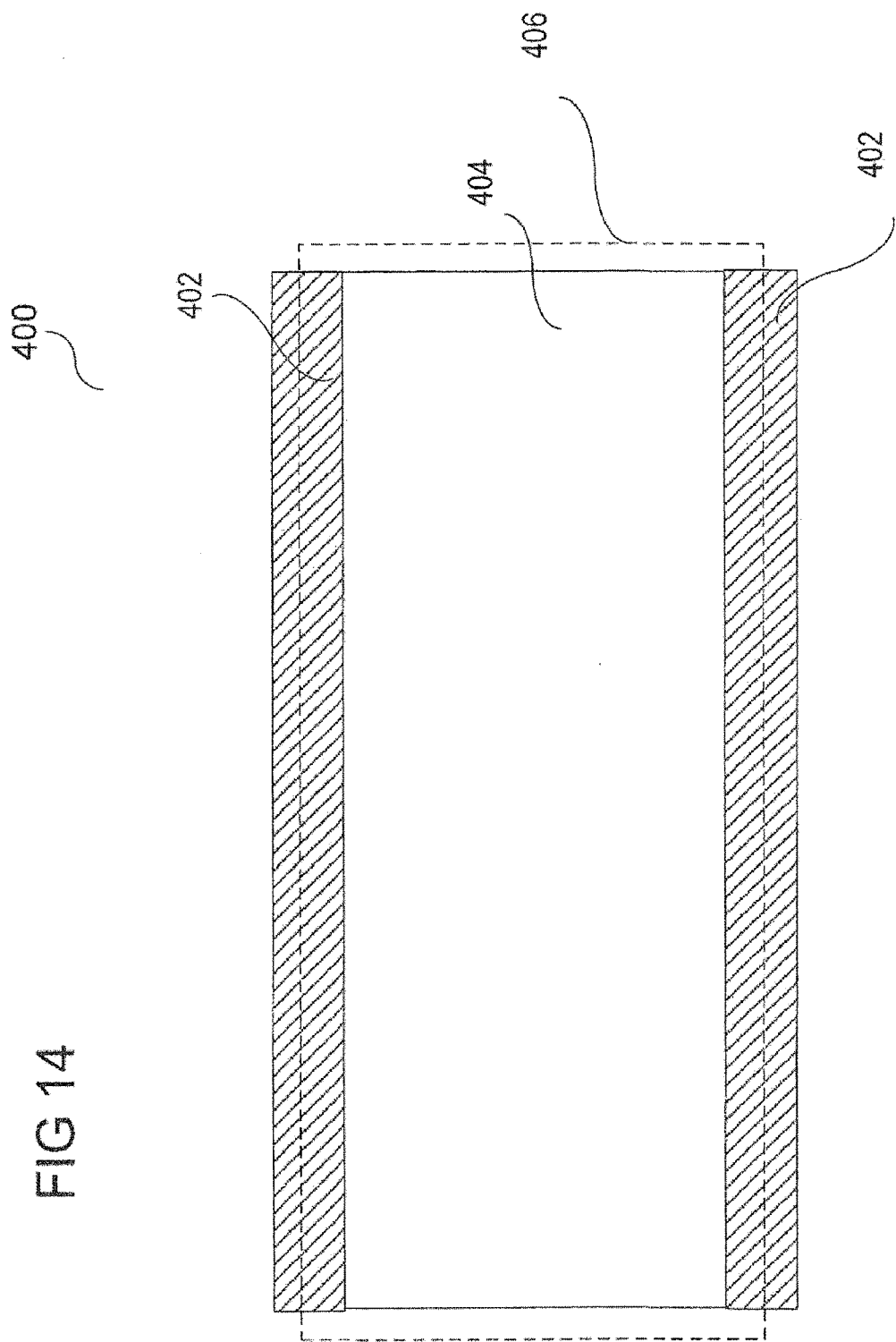
FIG. 14 shows a cross-sectional view of an electronic structure in accordance with various embodiments.

FIG. 14 shows a cross-sectional view of an electronic structure 400 in accordance with various embodiments. The electronic structure 400 is for example an OLED having transparent Ge/Ag contacts, which replaces the nontransparent metallic leads typically used.

In various embodiments, the OLED 400 can be a transparent OLED having transparent Ge/Ag contacts 402. The Ge/Ag contacts 402 are contacts formed from a metal growth layer 114 composed of germanium and a metal layer 116 composed of silver grown on the metal growth layer 114. The Ge/Ag contact is grown at least in regions on the metal growth layer side on an organic layer 112. The contacts are conductively connected to an emitting region 404, which is excited by the Ge/Ag contacts 402. The luminous region 404 can contain emitter layers described in FIG. 11, for example. The luminous region 404 can be embodied as transparent. The luminous region 404 and the Ge/Ag contacts 402 are arranged for example at least in regions on or below a substrate 406, for example a laminated glass, for example a flexible film.

In various embodiments, transparent Ge/Ag contacts 402 can be arranged for example on a rigid substrate 406, for example on a flexible substrate 406, for example for top emitting OLEDs 400.

Figure 15:
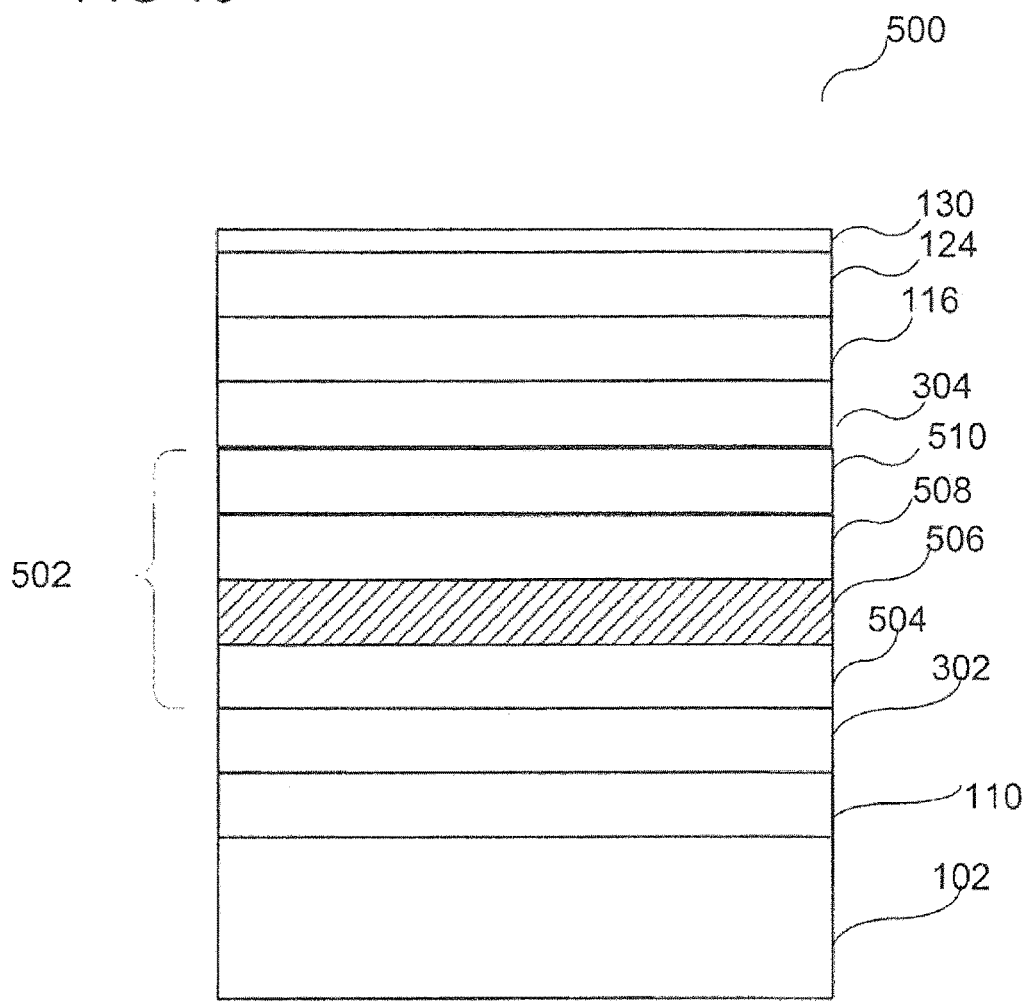
FIG. 15 shows a cross-sectional view of an electronic structure in accordance with various embodiments.

FIG. 15 shows a cross-sectional view of an electronic structure in accordance with various embodiments. In various embodiments, a first OLED unit 302 can be arranged on the substrate 102. A charge generation layer unit (CGL unit) 502 can be arranged on said OLED-first unit 302.

The charge generation layer unit 502 serves for example for vertically stacking for example a plurality of solar cell units or for example OLEDs. A stacked construction is thus made possible. The charge generation layer unit 502 is constructed for example from a, for example organic, n-conducting layer 504, a metal growth layer 506, which can contain germanium, for example, or consists of germanium, for example, a thin metal layer 508, for example silver, grown on the metal growth layer 506, wherein the metal layer 508 can have a layer thickness in a range of, for example, approximately 1 nm and approximately 5 nm, and a p-conducting layer 510. A second OLED unit 304 can be arranged on the p-conducting layer 510. By way of example, further OLED units and/or further charge generation layer units 502, or for example a top electrode 116 can be arranged on the second OLED unit 304. The top electrode 116 can be a Ge/Ag contact, for example. An antireflection coating 124 can optionally be arranged on the top electrode 116. A thin-film encapsulation 126 and/or an anti-scratch protective layer 132 can optionally be arranged.

Figure 16:
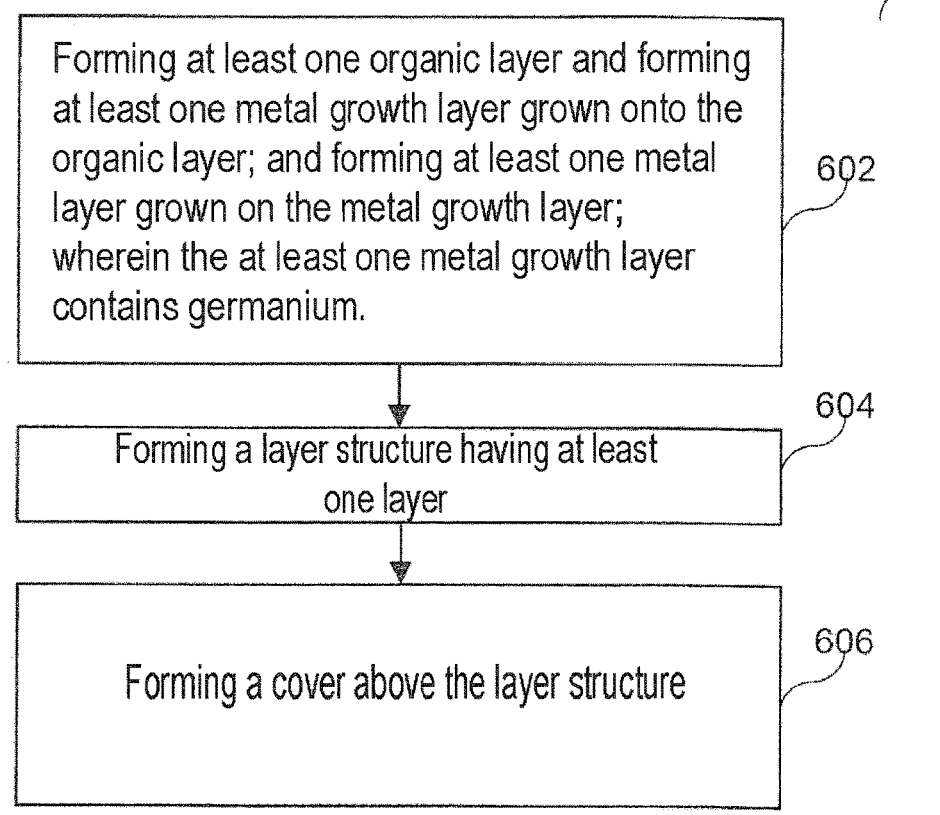
FIG. 16 shows a flow chart of a method for producing an electronic structure of a light-emitting component in accordance with various embodiments.

FIG. 16 shows a flow chart 600 illustrating a method for producing an electronic structure 100 in accordance with various embodiments. In 602, an electrically active region 108 is formed, wherein a first electrode 110, an organic layer or organic functional layer structure 112, a metal growth layer 114 and a metal layer 116, for example a second electrode, are formed, and wherein the metal growth layer 114 is grown onto the organic layer 112 and the metal layer 116 is grown onto the metal growth layer 114. Furthermore, in 604, a layer structure having at least one layer can be formed above the electrically active region, followed by forming a cover above the layer structure in 606.

The various layers, for example the intermediate layer 122 or intermediate layer structure 122, the electrodes 108, 112 and the other layers of the electrically active region 108 such as, for example, the organic functional layer structure 112, for example the hole transport layer(s) or electron transport layer(s) can be applied, for example deposited, by means of various processes, for example by means of a CVD method (chemical vapor deposition) or by means of a PVD method (physical vapor deposition, for example sputtering, ion-assisted deposition method or thermal evaporation), alternatively by means of a plating method; a dip coating method; a spin coating method; printing; blade coating; or spraying.

The metal growth layer 114 and the metal layer 116 can be deposited by means of a CVD method (chemical vapor deposition) or by means of a PVD method, for example thermal evaporation.

In various embodiments, a plasma enhanced chemical vapor deposition (PE-CVD) method can be used as CVD method. In this case, a plasma can be generated in a volume above and/or around the element to which the layer to be applied is intended to be applied, wherein at least two gaseous starting compounds are fed to the volume, said compounds being ionized in the plasma and excited to react with one another. The generation of the plasma can make it possible that the temperature to which the surface of the element is to be heated in order to make it possible to produce the dielectric layer, for example, can be reduced in comparison with a plasmaless CVD method. That may be advantageous, for example, if the element, for example the light-emitting electronic component to be formed, would be damaged at a temperature above a maximum temperature. By way of example, in the case of a light-emitting electronic component to be formed, in accordance with various embodiments, the maximum temperature can be approximately 120° C., such that the temperature at which the optional dielectric layer is applied, for example, can be less than or equal to 120° C., and for example less than or equal to 80° C.

Furthermore, in various embodiments, an antireflection coating 124 can be formed.

Furthermore, it can be provided that after forming the electrically active region and before forming the cover, the optical transparency of the structure having the electrically active region 108 is measured. The intermediate layer or intermediate layer structure can then be formed depending on the measured optical transparency, such that a desired optical target transparency of the structure having the electrically active region and of the intermediate layer or intermediate layer structure is obtained (in this regard, by way of example, the layer thickness and/or a choice of material of the intermediate layer or intermediate layer structure can be adapted).

In various embodiments, such a low refractive index layer can be introduced in the ongoing process flow as an additional layer on the encapsulation, for example the thin-film encapsulation.

In various embodiments, planarization or buffer layers 130, anti-scratch protective layer(s) 134 and/or scattering film(s) 134 can optionally be formed.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A method for producing an electronic structure, the method comprising:
   forming at least one organic layer;
   forming at least one metal growth layer grown onto the organic layer; and
   forming at least one metal layer grown on the metal growth layer;
   wherein the at least one metal growth layer consists of germanium.

2. The method as claimed in claim 1,
   wherein the at least one organic layer is a charge carrier transporting or injecting organic layer.

3. A method for producing an electronic structure, comprising:
   forming at least one organic layer;
   forming at least one metal growth layer grown onto the organic layer; and
   forming at least one metal layer grown on the metal growth layer;
   wherein the metal growth layer is an alloy of the system germanium-silver, of the system germanium-gold or of the system germanium-copper.

4. The method as claimed in claim 3,
   wherein the at least one organic layer is a charge carrier transporting or injecting organic layer.

* * * * *